US012660417B2

(12) United States Patent
Bai et al.

(10) Patent No.: US 12,660,417 B2
(45) Date of Patent: Jun. 16, 2026

(54) DISPLAY PANEL, DISPLAYING DEVICE AND MASK

(71) Applicant: BOE Technology Group Co., Ltd., Beijing (CN)

(72) Inventors: Shanshan Bai, Beijing (CN); Jianchao Zhu, Beijing (CN); Guangliang Shang, Beijing (CN); Danyang Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 607 days.

(21) Appl. No.: 18/028,017

(22) PCT Filed: Jun. 24, 2022

(86) PCT No.: PCT/CN2022/101215
§ 371 (c)(1),
(2) Date: Mar. 23, 2023

(87) PCT Pub. No.: WO2023/245641
PCT Pub. Date: Dec. 28, 2023

(65) Prior Publication Data
US 2024/0315076 A1 Sep. 19, 2024

(51) Int. Cl.
*H10K 59/121* (2023.01)
*C23C 14/04* (2006.01)
(Continued)

(52) U.S. Cl.
CPC ......... *H10K 59/121* (2023.02); *C23C 14/042* (2013.01); *H10K 59/80521* (2023.02); *H10K 59/353* (2023.02); *H10K 71/166* (2023.02)

(58) Field of Classification Search
CPC ........... H10K 59/121; H10K 59/80521; H10K 59/353; H10K 71/166; C23C 14/042
See application file for complete search history.

(56) References Cited

U.S. PATENT DOCUMENTS

| 2007/0262916 A1 | 11/2007 | Kee et al. |
| 2012/0267611 A1 | 10/2012 | Chung et al. |
| (Continued) | | |

FOREIGN PATENT DOCUMENTS

| CN | 108461521 A | 8/2018 |
| CN | 110764362 A | 2/2020 |
| (Continued) | | |

*Primary Examiner* — Mary Ellen Bowman
(74) *Attorney, Agent, or Firm* — WHDA, LLP

(57) ABSTRACT

A display panel includes a first displaying region and a second displaying region; the second displaying region is located in a first region of a display surface of the display panel, and a pixel density of the second displaying region is a preset multiple of a pixel density of the first displaying region, whereby a transmittance of the second displaying region is greater than a transmittance of the first displaying region; the second displaying region is provided with first cathode-removal regions, and the first cathode-removal regions are located in gaps between at least two pixel units in the second displaying region; and the preset multiple is a multiple value less than 1 and greater than 0, and the first region is a region facing a region of a bottom of the display surface of the display panel where a functional element is provided.

18 Claims, 14 Drawing Sheets

(51) Int. Cl.
    H10K 59/35        (2023.01)
    H10K 59/80        (2023.01)
    H10K 71/16        (2023.01)

(56)        References Cited

U.S. PATENT DOCUMENTS

| | | | |
|---|---|---|---|
| 2020/0066809 A1 | 2/2020 | Liu | |
| 2021/0141304 A1 | 5/2021 | Liu et al. | |
| 2022/0005906 A1* | 1/2022 | Jeong | H10K 59/121 |
| 2022/0013083 A1* | 1/2022 | Cheng | G09F 9/30 |
| 2022/0352289 A1* | 11/2022 | Liu | H10K 59/1315 |
| 2023/0082133 A1* | 3/2023 | Sun | G09G 3/30 |
| | | | 257/89 |

FOREIGN PATENT DOCUMENTS

| | | | |
|---|---|---|---|
| CN | 111863904 A | 10/2020 | |
| CN | 112150916 A | 12/2020 | |
| CN | 113889508 A | 1/2022 | |

\* cited by examiner

DISPLAY PANEL, DISPLAYING DEVICE AND MASK

TECHNICAL FIELD

The present disclosure relates to the technical field of displaying devices, and particularly relates to a display panel, a displaying device and a mask.

BACKGROUND

With the development of displaying devices, the display panels of the displaying devices are developing continuously with the trends of a lighter screen, a wider visual angle, flexible displaying and a lower power consumption. Among them, the displaying devices with a full screen are increasingly more popular with the users. In the development of full screens, approaches such as the bang screen, the popping-up screen, the water-drop screen and the hole screen have been used to increase the screen-to-body ratio of the displaying devices. However, all of those approaches compromise the effect of displaying of the screen to a certain extent, and they are not a full screen in the true sense.

Currently, the functional elements such as the camera and the sensitimeter are usually completely hidden under the screen, to increase the screen-to-body ratio of the displaying devices to the largest extent. However, the transmittance of the region of the display panels of the displaying devices where the functional elements are provided is lower as compared with the requirement on light sensation by the functional elements, which deteriorates the optical effect and the displaying effect of the display panels.

SUMMARY

The embodiments of the present disclosure provide a display panel, a displaying device and a mask, to solve the problem in the related art that the optical effect and the displaying effect of display panels are poorer in the region where the functional elements are provided.

In order to solve the above technical problem, the present disclosure is realized as follows:

In the first aspect, an embodiment of the present disclosure provides a display panel, wherein the display panel includes a first displaying region and a second displaying region;

the second displaying region is located in a first region of a display surface of the display panel, and a pixel density of the second displaying region is a preset multiple of a pixel density of the first displaying region, whereby a transmittance of the second displaying region is greater than a transmittance of the first displaying region;

the second displaying region is provided with first cathode-removal regions, and the first cathode-removal regions are located in gaps between at least two pixel units in the second displaying region; and the preset multiple is a multiple value less than 1 and greater than 0, and the first region is a region facing a region of a bottom of the display surface of the display panel where an optical functional element is provided.

Optionally, a shape of a sub-pixel opening of at least one of the pixel units in the second displaying region is circular.

Optionally, the first cathode-removal regions are arranged in an array.

Optionally, the display panel further includes a substrate baseplate; and projections of the first cathode-removal regions on the substrate baseplate and projections of luminescent layers of the pixel units in the second displaying region on the substrate baseplate do not overlap.

Optionally, a minimum distance between sub-pixels of a same color in two neighboring pixel units in the first displaying region is a first distance; and a minimum distance between sub-pixels of a same color in two neighboring instances of the pixel units in the second displaying region is a second distance, wherein the first distance is greater than the second distance.

Optionally, the display panel further includes a third displaying region; and the third displaying region is located between the first displaying region and the second displaying region, and a pixel density of the third displaying region is greater than the pixel density of the second displaying region, and less than the pixel density of the first displaying region.

Optionally, the third displaying region is provided with second cathode-removal regions; and the second cathode-removal regions are located in gaps between at least two pixel units in the third displaying region.

Optionally, shapes of the first cathode-removal regions and shapes of the second cathode-removal regions are at least one of a circle and an ellipse.

Optionally, the pixel density of the third displaying region is a half of the pixel density of the first displaying region, the pixel density of the second displaying region is a quarter of the pixel density of the first displaying region, the pixel units in the third displaying region are evenly distributed, and the pixel units in the second displaying region are evenly distributed.

Optionally, the second cathode-removal regions are located in gaps between two neighboring pixel units in the third displaying region; and the first cathode-removal regions are located between every two neighboring rows of the pixel units in the second displaying region.

Optionally, every two neighboring rows of the second cathode-removal regions are distributed in stagger.

Optionally, the display panel further includes a pixel-circuit baseplate;

the pixel-circuit baseplate includes a shielding layer and a barrier layer, the shielding layer is provided inside the barrier layer, a first opening pattern and a second opening pattern are provided inside the barrier layer, and a projection of the first opening pattern on the barrier layer in a first direction and projections of the first cathode-removal regions on the barrier layer in the first direction coincide;

a projection of the second opening pattern on the barrier layer in the first direction and projections of the second cathode-removal regions on the barrier layer in the first direction coincide, wherein the first direction refers to a direction perpendicular to a plane where the barrier layer is located; and shapes of the first cathode-removal regions and a shape of the first opening pattern are the same, and shapes of the second cathode-removal regions and a shape of the second opening pattern are the same.

Optionally, the pixel-circuit baseplate further includes a source-drain metal layer, an electrically insulating layer, a passivation layer and a grid insulating layer; and the electrically insulating layer is located between the passivation layer and the grid insulating layer, the shielding layer is connected to the source-drain metal layer by the electrically insulating layer, and the shielding layer is of a metal material.

Optionally, the display panel further includes a substrate baseplate;

wirings of transverse signal lines between the pixel units in the third displaying region enclose a first pattern;

wirings of longitudinal signal lines between the pixel units in the third displaying region enclose a second pattern;

a projection of the first pattern on the substrate baseplate and a projection of each of the second cathode-removal regions on the substrate baseplate coincide, and a projection of the second pattern on the substrate baseplate and a projection of each of the second cathode-removal regions on the substrate baseplate coincide; and a shape of a cavity enclosed by the first pattern and a shape of the second cathode-removal regions are the same, and a shape of a cavity enclosed by the second pattern and the shape of the second cathode-removal regions are the same.

Optionally, when the shapes of the second cathode-removal regions are circular, both of the shape of the first pattern and the shape of the second pattern are circular.

Optionally, wirings of signal lines between the pixel units in the second displaying region and the pixel units in the third displaying region are straight lines.

Optionally, each of the pixel units in the second displaying region includes three sub-pixels, and connecting lines between center points of the three sub-pixels of at least one of the pixel units in the second displaying region form a triangle.

Optionally, a value of the pixel density of the first displaying region, a value of the pixel density of the third displaying region and a value of the pixel density of the second displaying region form an arithmetic progression or a geometric progression.

In the second aspect, an embodiment of the present disclosure further provides a displaying device, wherein the displaying device includes a functional element and the display panel according to any one of the embodiments in the first aspect. A projection of a sensing component or a function triggering component of the functional element on a substrate baseplate at least partially overlaps with projections of the cathode-removal regions on the substrate baseplate.

Optionally, a projection of a sensing component or a function triggering component of the functional element on a substrate baseplate at least partially overlaps with projections of the cathode-removal regions on the substrate baseplate.

In the third aspect, an embodiment of the present disclosure further provides a mask, the mask being used for forming the display panel according to any one of the embodiments in the first aspect by vapor deposition, wherein the mask includes a first opening region and a second opening region;

the first opening region is for vapor-depositing the first displaying region, and the second opening region is for vapor-depositing the second displaying region;

the first opening region includes a plurality of first pixel openings, the second opening region includes a plurality of second pixel openings, shapes of the first pixel openings and shapes of mask openings of the pixel units in the first displaying region are the same, and shapes of the second pixel openings and shapes of the mask openings of the pixel units in the second displaying region are the same; and each of the first pixel openings is opposite to one of the pixel units in the first displaying region, each of the pixel units in the second displaying region is opposite to one of the second pixel openings, and a gap position between every two neighboring pixel units in the second displaying region is opposite to one of the second pixel openings.

Optionally, the pixel units in the second displaying region are evenly distributed; and a quantity of the first pixel openings and a quantity of the second pixel openings are equal, and a form of arrangement of the first pixel openings in the first opening region and a form of arrangement of the second pixel openings in the second opening region are the same;

wherein the arrangement of the first pixel openings in the first opening region refers to quantities of the first pixel openings provided in a transverse direction and a longitudinal direction of the first opening region, and the arrangement of the second pixel openings in the second opening region refers to quantities of the second pixel openings provided in a transverse direction and a longitudinal direction of the second opening region.

Optionally, the display panel further includes a third displaying region;

the mask further includes a third opening region, and the third opening region is for vapor-depositing the third displaying region; and the third opening region includes a plurality of third pixel openings, shapes of the third pixel openings and shapes of the mask openings of the pixel units in the third displaying region are the same, each of the pixel units in the third displaying region faces one of the third pixel openings, and a gap position between every two neighboring instances of the pixel units in the third displaying region faces one of the second pixel openings.

It can be seen from the above embodiments that, in the embodiments of the present disclosure, because the pixel density of the second displaying region is a preset multiple of the pixel density of the first displaying region, and the preset multiple is a multiple value less than 1 and greater than 0, the area of the gap between two neighboring pixel units in the second displaying region is increased as compared with the area of the gap between two neighboring pixel units in the first displaying region. Additionally, the second displaying region is provided with the first cathode-removal regions, and the first cathode-removal regions are located in the gaps between at least two pixel units in the second displaying region, whereby the transmittance of the second displaying region is greater than the transmittance of the first displaying region. Further, because the second displaying region is located in a first region of the display surface of the display panel, and the first region is a region opposite to the region of the bottom of the display surface of the display panel where a functional element is provided, the transmittance of the region of the display surface of the display panel that is opposite to the region where the functional element is provided is increased as compared with the transmittances of the other regions, which enables the functional element to normally sense light, thereby improving the optical effect and the displaying effect of the display panel.

BRIEF DESCRIPTION OF THE DRAWINGS

In order to more clearly illustrate the technical solutions of the embodiments of the present disclosure or the prior art, the figures that are required to describe the embodiments or the prior art will be briefly described below. Apparently, the figures that are described below are embodiments of the present disclosure, and a person skilled in the art can obtain other figures according to these figures without paying creative work.

REFERENCE NUMBERS

1: first displaying region; 2: second displaying region; 3: third displaying region; 4: pixel-circuit baseplate; 5: first opening region; 6: second opening region; 7: third opening region; 21: first cathode-removal regions; 31: second cathode-removal regions; 35: transverse signal lines; 32: longitudinal signal lines; 33: first pattern; 34: second pattern; 41: shielding layer; 42: barrier layer; 43: source-drain metal layer; 44: electrically insulating layer; 45: passivation layer; 46: grid insulating layer; 51: first pixel openings; 61: second pixel openings; and 71: third pixel openings.

DETAILED DESCRIPTION

The technical solutions according to the embodiments of the present disclosure will be clearly and completely described below with reference to the drawings according to the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall in the protection scope of the present disclosure.

It should be understood that the "one embodiment" or "an embodiment" as used throughout the description means that particular features, structures or characteristics with respect to the embodiments are included in at least one embodiment of the present disclosure. Therefore, the "in one embodiment" or "in an embodiment" as used throughout the description does not necessarily refer to the same embodiment. Furthermore, those particular features, structures or characteristics may be combined in one or more embodiments in any suitable form.

Figure 1:
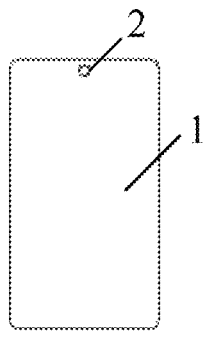
FIG. 1 shows a schematic structural diagram of a display panel according to an embodiment of the present disclosure.
Figure 2:
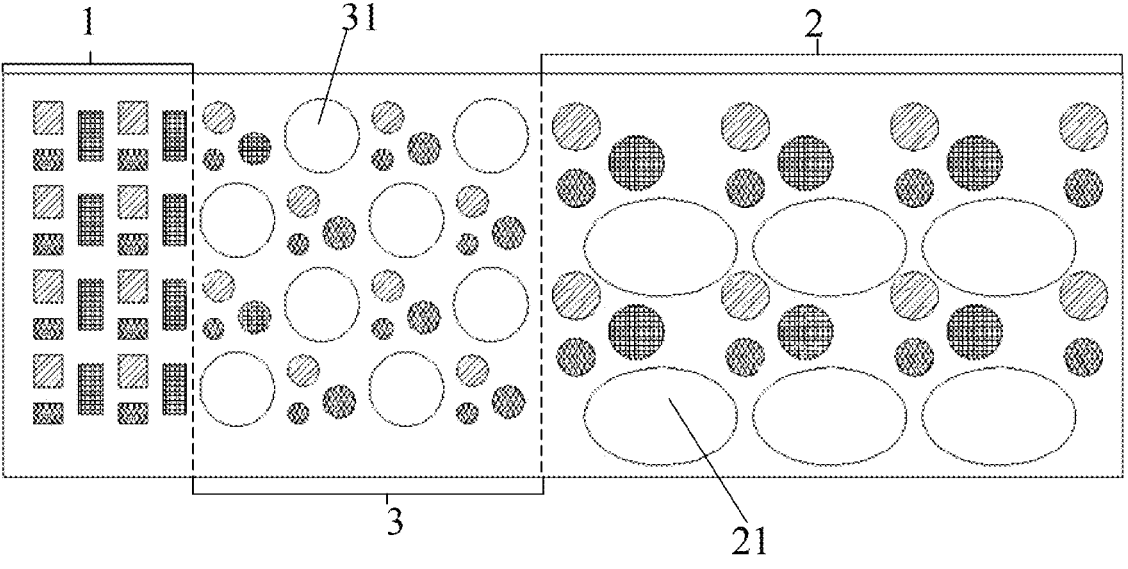
FIG. 2 shows a schematic diagram of the arrangement of the pixel units included in a display panel according to an embodiment of the present disclosure.
Figure 3:
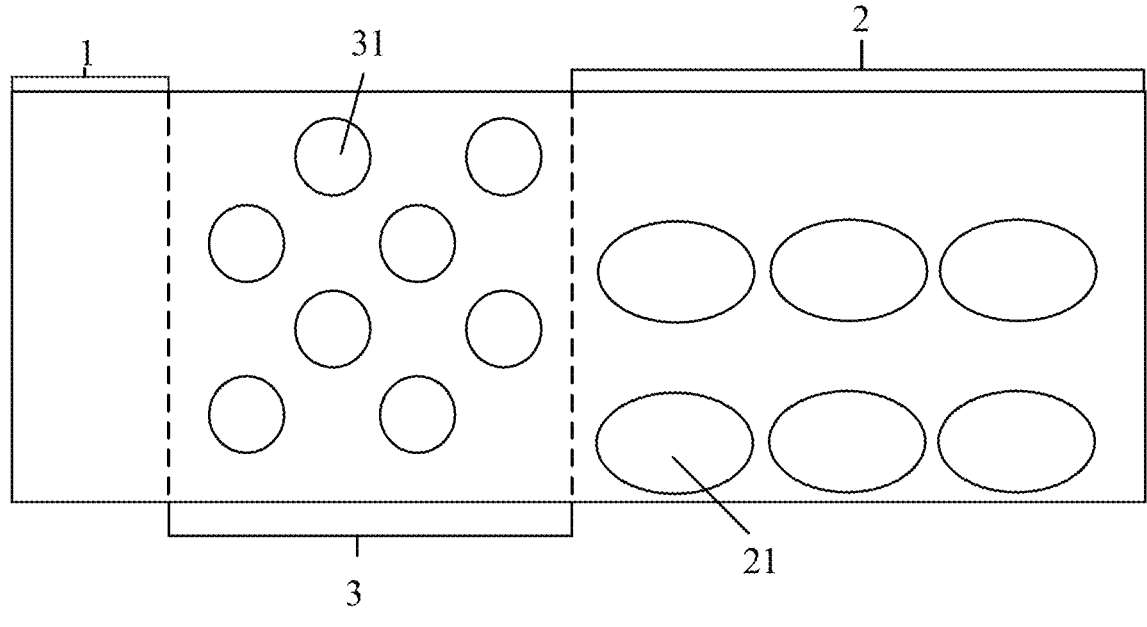
FIG. 3 shows a schematic diagram of the arrangement of the first cathode-removal regions and the second cathode-removal regions included in a display panel according to an embodiment of the present disclosure.
Figure 4:
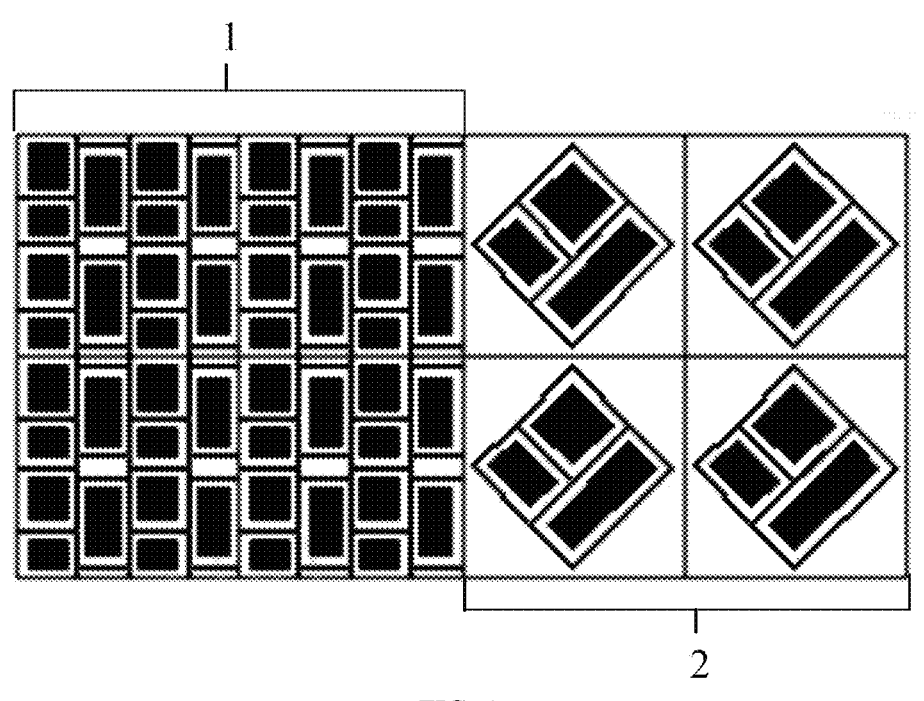
FIG. 4 shows a schematic diagram of the first type of arrangement of the pixel units included in the first displaying region according to an embodiment of the present disclosure.

In the first aspect, an embodiment of the present disclosure provides a display panel. FIG. 1 shows a schematic structural diagram of a display panel according to an embodiment of the present disclosure. FIG. 2 shows a schematic diagram of the arrangement of the pixel units included in a display panel according to an embodiment of the present disclosure. As shown in FIGS. 1, 2 and 3, the display panel includes a first displaying region 1 and a second displaying region 2. The second displaying region 2 is located in a first region of the display surface of the display panel, and the pixel density of the second displaying region 2 is a preset multiple of the pixel density of the first displaying region 1, whereby the transmittance of the second displaying region 2 is greater than the transmittance of the first displaying region 1. The second displaying region 2 is provided with first cathode-removal regions 21, and the first cathode-removal regions 21 are located in the gaps between at least two pixel units in the second displaying region 2. The preset multiple is a multiple value less than 1 and greater than 0, and the first region is a region opposite to the region of the bottom of the display surface of the display panel where an optical functional element is provided.

The first displaying region 1 is the primary region that serves to display in the display panel. The second displaying region 2 is a region opposite to the region of the bottom of the display surface of the display panel where the optical functional element is provided. The second displaying region 2 may be located at any one position of the display surface of the display panel, and the particular position is determined according to the position in the display panel where the optical functional element is provided. The optical functional element may be optical elements such as a camera and a sensitimeter, which is not limited in the embodiments of the present disclosure. Furthermore, the shape of the second displaying region 2 may be any shape such as a circle, a square, an ellipse, a rhombus, a polygon and an irregular shape, which is not limited in the embodiments of the present disclosure.

In order to improve the optical effect and the displaying effect of the display panel in the second displaying region 2, the pixel density of the second displaying region 2 is a preset multiple of the pixel density of the first displaying region 1, and the preset multiple is a multiple value less than 1 and greater than 0. For example, the pixel density of the second displaying region 2 is any multiple of the pixel density of the first displaying region, such as ⅔, ½, ⅓ and ¼. Accordingly, the area of the gap between two neighboring pixel units in the second displaying region 2 is increased as compared with the area of the gap between two neighboring pixel units in the first displaying region 1, wherein the gap refers to the region of the first displaying region 1 or the second displaying region 2 where no pixel unit is provided, whereby the transmittance of the second displaying region 2 is greater than the transmittance of the first displaying region 1. It should be noted that, in the embodiments of the present disclosure, the pixel unit refers to the basic unit that forms the basic primary colours and grayscales of the display panel, and each of the pixel units includes one red-color sub-pixel, one green-color sub-pixel and one blue-color sub-pixel.

Furthermore, it should be noted that the first cathode-removal regions 21 may be fabricated by vapor-depositing the cathode on the entire surface, and subsequently removing the cathode in a pattern by using laser. That may also be performed by vacuum vapor deposition by using a vapor-deposition mask, which particularly includes, before the vapor deposition of the cathode, firstly vapor-depositing a layer of a material rejecting the cathode material by using a patterned mask, which is referred to as an inhibitor, wherein the pattern of the cathode inhibitor material is the same as the pattern of the cathode-removal parts. After the deposition of the inhibitor material has been completed, the deposition of the cathode at the entire surface is subsequently performed. Because of the repulsive effect between the materials, the cathode cannot be adhered to the regions that have already had the inhibitor pattern, whereby the patterned cathode removal is realized, and the first cathode-removal regions 21 are formed in the second displaying region 2.

Figure 11:
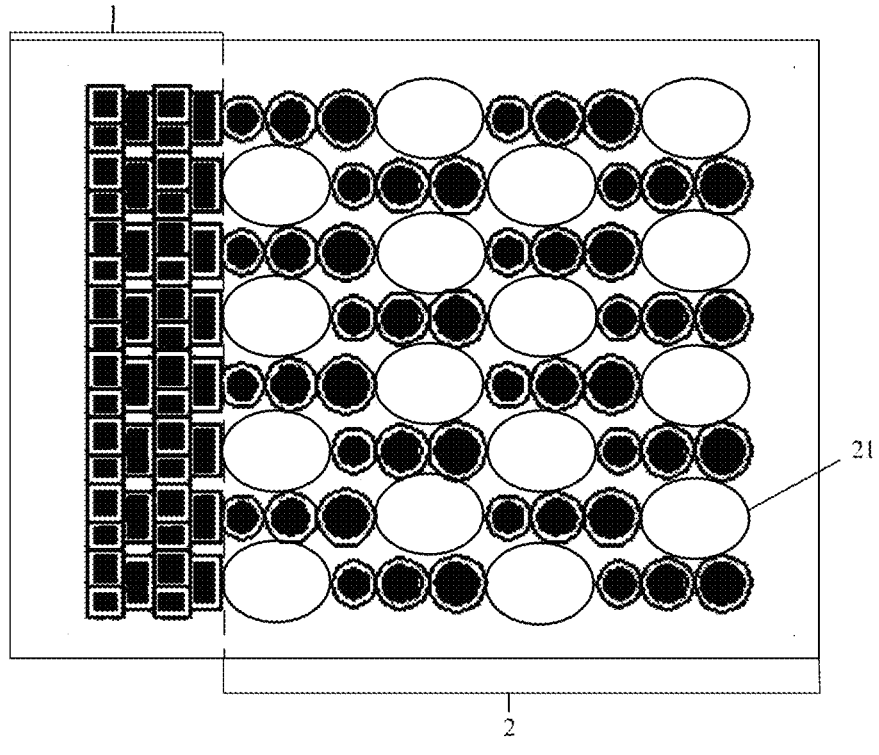
FIG. 11 shows a schematic diagram of the first type of arrangement of the first cathode-removal regions included in the first displaying region according to an embodiment of the present disclosure.
Figure 12:
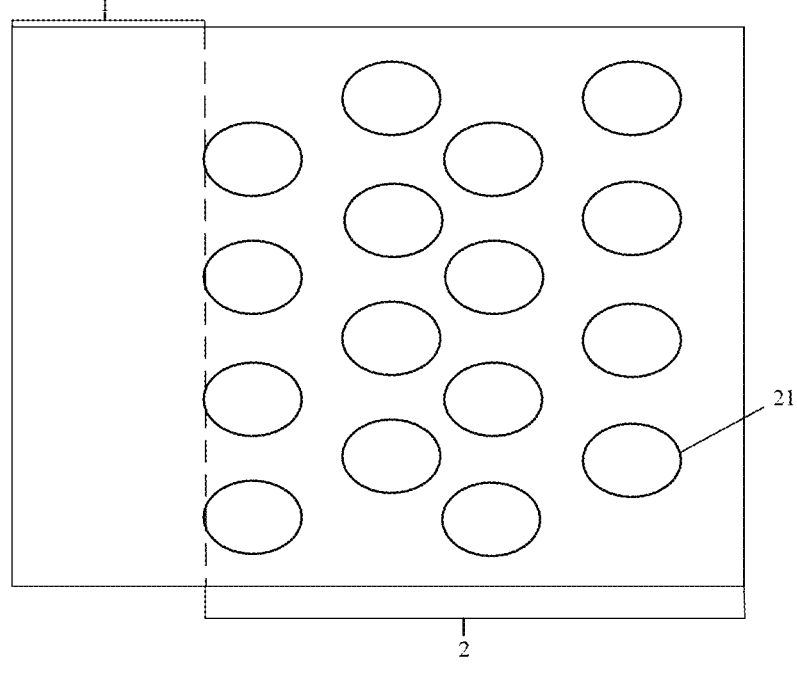
FIG. 12 shows a schematic diagram of the arrangement in FIG. 11 of the first cathode-removal regions included in the first displaying region according to an embodiment of the present disclosure.
Figure 13:
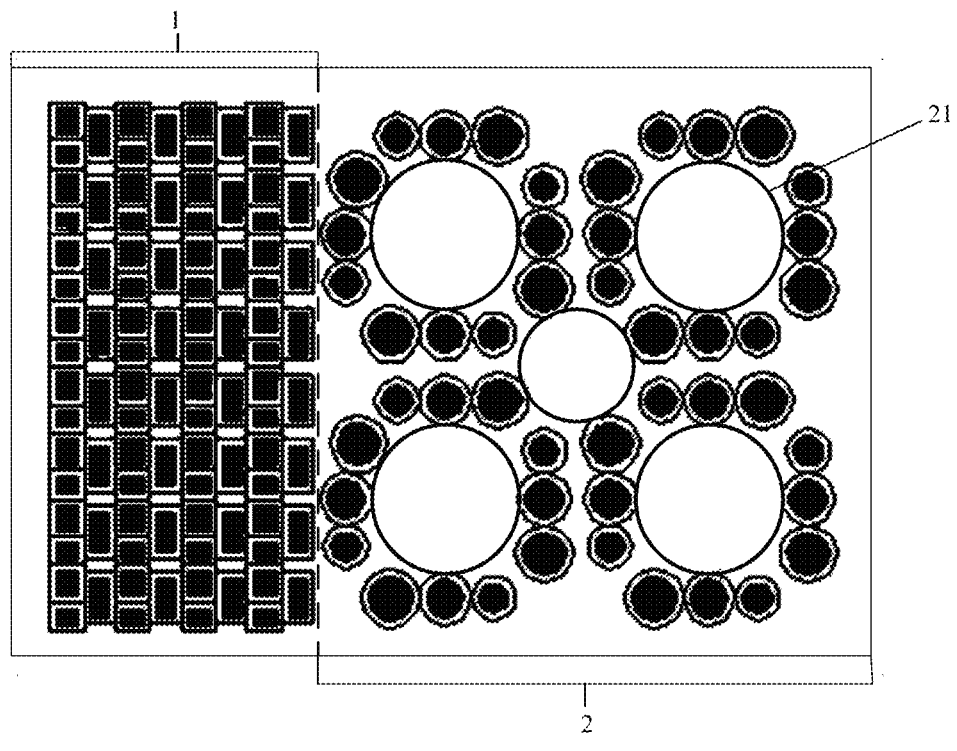
FIG. 13 shows a schematic diagram of the second type of arrangement of the first cathode-removal regions included in the first displaying region according to an embodiment of the present disclosure.
Figure 14:
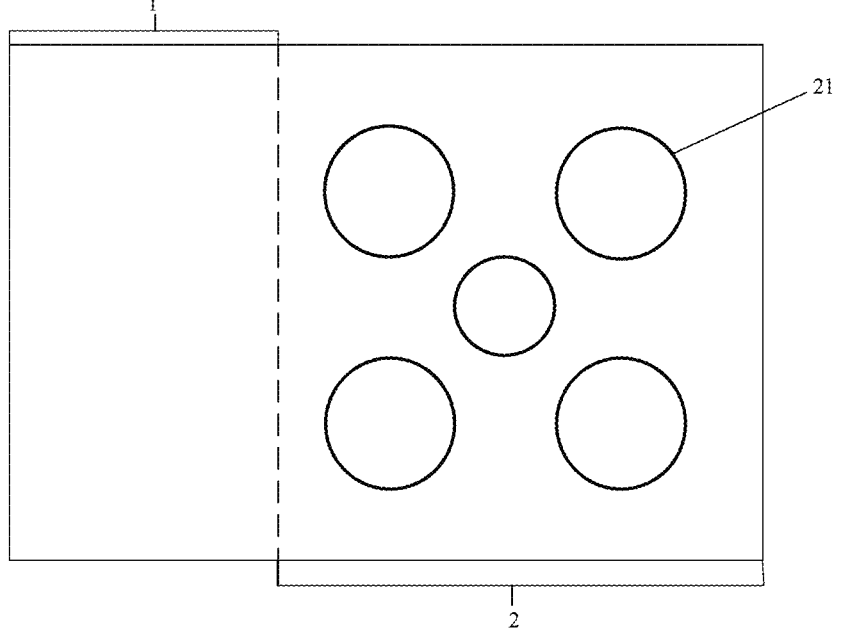
FIG. 14 shows a schematic diagram of the arrangement in FIG. 13 of the first cathode-removal regions included in the first displaying region according to an embodiment of the present disclosure.
Figure 15:
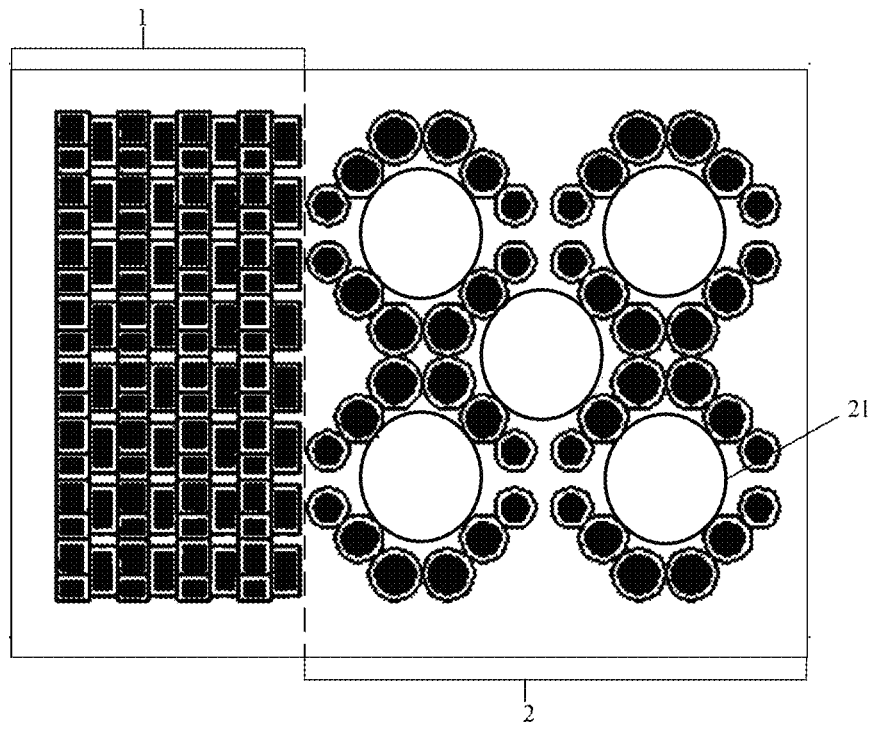
FIG. 15 shows a schematic diagram of the third type of arrangement of the first cathode-removal regions included in the first displaying region according to an embodiment of the present disclosure.
Figure 16:
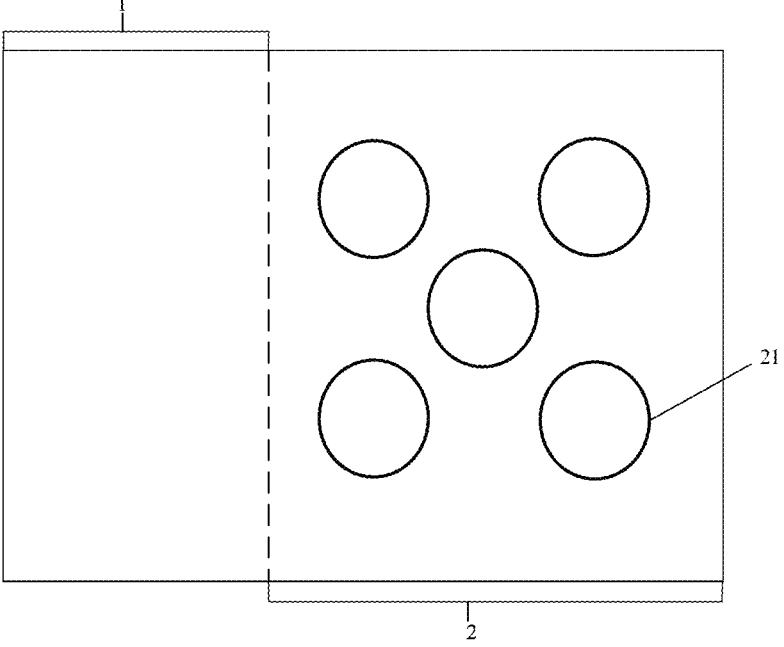
FIG. 16 shows a schematic diagram of the arrangement in FIG. 15 of the first cathode-removal regions included in the first displaying region according to an embodiment of the present disclosure.
Figure 17:
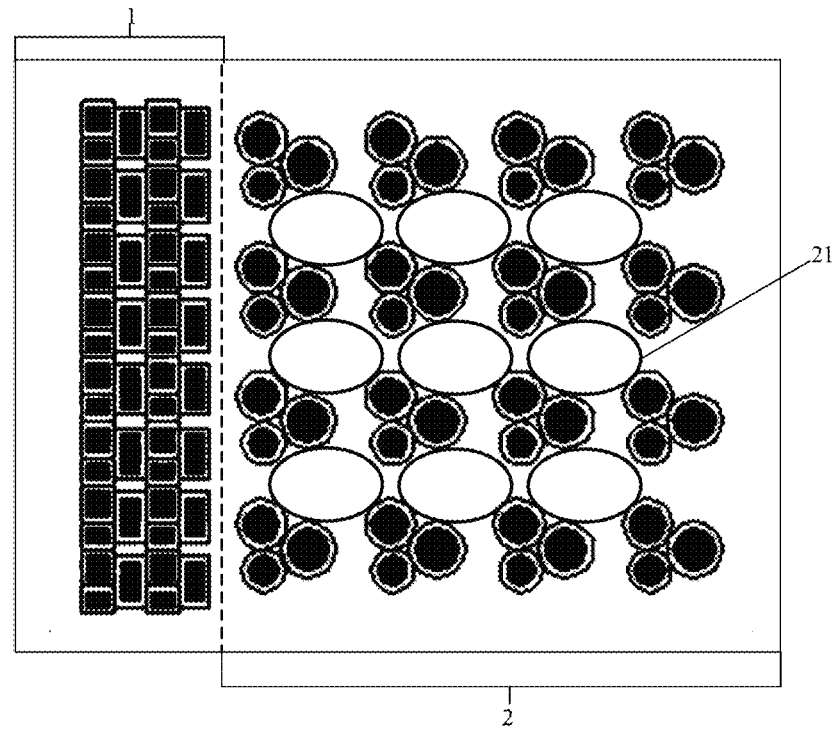
FIG. 17 shows a schematic diagram of the fourth type of arrangement of the first cathode-removal regions included in the first displaying region according to an embodiment of the present disclosure.
Figure 18:
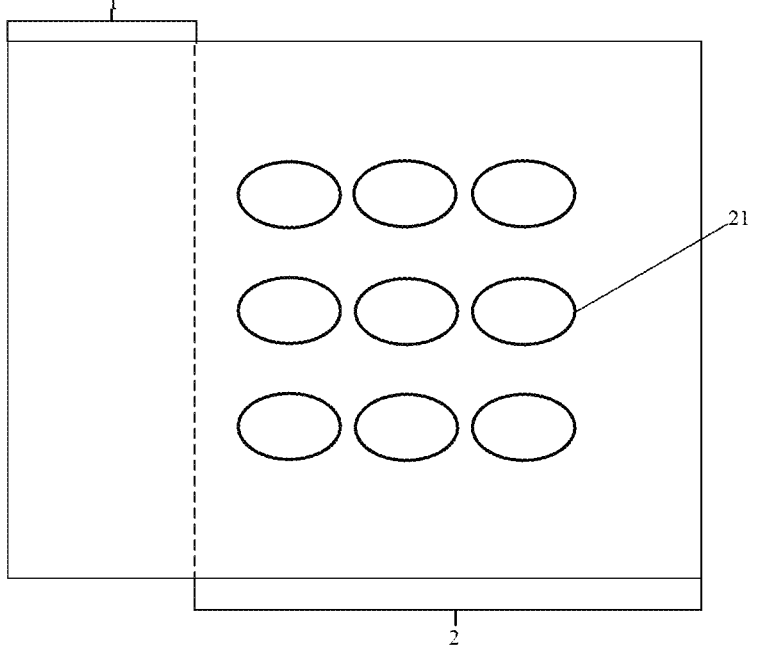
FIG. 18 shows a schematic diagram of the arrangement in FIG. 17 of the first cathode-removal regions included in the first displaying region according to an embodiment of the present disclosure.

It should also be noted that, as shown in FIGS. 11 to 18, the first cathode-removal regions 21 may be located in the gap between two neighboring pixel units in the transverse direction of the second displaying region 2. As shown in FIGS. 11 and 17, the first cathode-removal regions 21 may also be located in the gap between two neighboring pixel units in the longitudinal direction of the second displaying region 2. As shown in FIGS. 13 and 15, the first cathode-removal regions 21 may also be located in the gap of the pattern enclosed by a plurality of neighboring pixel units in the second displaying region 2. The shape and the distribution mode of the first cathode-removal regions 21 are determined according to the distribution mode of the pixel units in the second displaying region 2, and are not limited in the embodiments of the present disclosure. Accordingly, by providing the first cathode-removal regions 21 in the second displaying region 2, the transmittances of the second displaying region 2 and the third displaying region 3 can be further increased, thereby further improving the optical effect and the displaying effect of the display panel.

Optionally, in some embodiments, as shown in FIGS. 11 to 18, the first cathode-removal regions 21 may be arranged in an array. That facilitates to provide the first cathode-removal regions 21, and enables the first cathode-removal regions 21 to be evenly distributed in the second displaying region 2, whereby the transmittances of the second displaying region 2 in the regions maintain equal.

Furthermore, it should be noted that the display panel further includes a substrate baseplate. The projections of the first cathode-removal regions 21 on the substrate baseplate and the projections of luminescent layers of the pixel units in the second displaying region 2 on the substrate baseplate do not overlap. That can ensure that the provision of the first cathode-removal regions 21 does not affect the normal displaying of the second displaying region 2, to ensure the effect of displaying of the second displaying region 2.

It can be seen from the above embodiments that, in the embodiments of the present disclosure, because the pixel density of the second displaying region 2 is a preset multiple of the pixel density of the first displaying region 1, and the preset multiple is a multiple value less than 1 and greater than 0, the area of the gap between two neighboring pixel units in the second displaying region 2 is increased as compared with the area of the gap between two neighboring pixel units in the first displaying region 1. Additionally, the second displaying region 2 is provided with the first cathode-removal regions 21, and the first cathode-removal regions 21 are located in the gaps between at least two pixel units in the second displaying region 2, whereby the transmittance of the second displaying region 2 is greater than the transmittance of the first displaying region 1. Further, because the second displaying region 2 is located in the first region of the display surface of the display panel, and the first region is a region opposite to the region of the bottom of the display surface of the display panel where a functional element is provided, the transmittance of the region of the display surface of the display panel that is opposite to the region where the functional element is provided is increased as compared with the transmittances of the other regions, which enables the functional element to normally sense light, thereby improving the optical effect and the displaying effect of the display panel.

In order to further improve the optical effect and the displaying effect of the display panel in the second displaying region 2, i.e., further increase the transmittance of the second displaying region 2, in the embodiments of the present disclosure, the transmittance of the second displaying region 2 may be increased in the manners such as changing the shapes of the sub-pixels of the pixel units and changing the form of the arrangement of the pixel units, which may particularly include the following modes:

In some embodiments, as shown in FIG. 2, the shape of a sub-pixel opening of at least one of the pixel units in the second displaying region 2 is circular. That can enable the spacings in all directions between the sub-pixels of each of the pixel units in the second displaying region 2 to be equal, which, in an aspect, is beneficial to the brightness decay and the even symmetry of the optical color cast of the display panel, and, in another aspect, can facilitate to ameliorate color separation with the circular-are-shaped boundary of the sub-pixels.

In some other embodiments, as shown in FIGS. 4, 5, 6, 7 and 8, when each of the pixel units in the second displaying region 2 includes three sub-pixels, and the connecting lines between the center points of the three sub-pixels of each of the pixel units in the second displaying region 2 form a triangle. That can enable the three sub-pixels of each of the pixel units in the second displaying region 2 to be closer to each other, and therefore the distances between the three sub-pixels are reduced, so as to increase the distances between two neighboring pixel units in the second displaying region 2, i.e., increase the areas of the gaps between two neighboring pixel units in the second displaying region 2, which facilitates to further increase the transmittance of the second displaying region 2.

In order to achieve the above effect, optionally, the three sub-pixels of each of the pixel units in the second displaying region 2 accumulate in the directions of approaching each other. Accordingly, the spacings between the three sub-pixels of each of the pixel units in the second displaying region 2 are further reduced, to further increase the areas of the gaps between two neighboring pixel units in the second displaying region 2, which facilitates to further increase the transmittance of the second displaying region 2.

Optionally, the minimum distance between sub-pixels of the same color in two neighboring pixel units in the first displaying region 1 is a first distance. The minimum distance between sub-pixels of the same color in two neighboring pixel units in the second displaying region 2 is a second distance, wherein the first distance is greater than the second distance. Accordingly, it can be ensured that the transmittance of the second displaying region 2 is greater than the transmittance of the first displaying region 1.

Furthermore, as shown in FIGS. 9, 10, 13 and 15, the connecting lines between the center points of the three sub-pixels of each of the pixel units in the second displaying region 2 may also be a straight line or a curve. Accordingly, the three sub-pixels of each of the pixel units in the second displaying region 2 are arranged regularly to a certain extent, which can also increase the distances between two neighboring pixel units in the second displaying region 2, i.e., increase the areas of the gaps between two neighboring pixel units in the second displaying region 2, which facilitates to further increase the transmittance of the second displaying region 2.

Alternatively, as shown in FIG. 2, in some embodiments, the display panel further includes a third displaying region 3, the third displaying region 3 is located between the first displaying region 1 and the second displaying region 2, and the pixel density of the third displaying region 3 is greater than the pixel density of the second displaying region 2, and less than the pixel density of the first displaying region.

It should be noted that, because the third displaying region 3 is located between the first displaying region 1 and the second displaying region 2, and the pixel density of the third displaying region 3 is greater than the pixel density of the second displaying region 2, and less than the pixel density of the first displaying region, the pixel density of the third displaying region 3 is between the pixel density of the first displaying region and the pixel density of the second displaying region 2, and therefore the transmittance of the third displaying region 3 is between the transmittance of the first displaying region and the transmittance of the second displaying region 2. Accordingly, the transmittance of the display panel progressively increases sequentially in the first displaying region 1, the third displaying region 3 and the second displaying region 2. Therefore, the increasing of the transmittance of the display panel has a transition region, and the displaying of the third displaying region 3 serves to transition and buffer, which prevents obvious boundary difference between the first displaying region 1 and the second displaying region 2 caused by pixel unbalance, to improve the uniformity of the brightness and the displaying of the display panel.

Optionally, the value of the pixel density of the first displaying region 1, the value of the pixel density of the third displaying region 3 and the value of the pixel density of the second displaying region 2 form an arithmetic progression or a geometric progression.

It should be noted that, in an alternative implementation, the value of the pixel density of the first displaying region 1, the value of the pixel density of the third displaying region 3 and the value of the pixel density of the second displaying region 2 form an arithmetic progression. In other words, the difference between the value of the pixel density of the third displaying region 3 and the value of the pixel density of the first displaying region 1 is equal to the difference between the value of the pixel density of the second displaying region 2 and the value of the pixel density of the third displaying region 3. Therefore, the transmittance of the display panel uniformly progressively increases in the first displaying region 1, the third displaying region 3 and the second displaying region 2, which facilitates to further prevent obvious boundary difference between the first displaying region 1 and the second displaying region 2 caused by pixel unbalance.

In another alternative implementation, the value of the pixel density of the first displaying region 1, the value of the pixel density of the third displaying region 3 and the value of the pixel density of the second displaying region 2 form a geometric progression. Because the value of the pixel density of the first displaying region 1, the value of the pixel density of the third displaying region 3 and the value of the pixel density of the second displaying region 2 form an arithmetic progression or a geometric progression, the transmittance of the display panel progressively increases in steps in the first displaying region 1, the third displaying region 3 and the second displaying region 2, which facilitates to further prevent obvious boundary difference between the first displaying region 1 and the second displaying region 2 caused by pixel unbalance.

Particularly, as shown in FIG. 2, the pixel density of the third displaying region 3 is a half of the pixel density of the first displaying region 1, the pixel density of the second displaying region 2 is a quarter of the pixel density of the first displaying region 1, the pixel units in the third displaying region 3 are evenly distributed, and the pixel units in the second displaying region 2 are evenly distributed.

It should be noted that the positions of the pixel units in the third displaying region 3 and the positions of the pixel units in the first displaying region 1 maintain the same, ½ of the pixel units are evenly removed, and, in the second displaying region 2, based on the third displaying region 3, one row of the pixels are removed every two rows. Accordingly, the pixel density of the third displaying region 3 is a half of the pixel density of the first displaying region 1, and the pixel density of the second displaying region 2 is a quarter of the pixel density of the first displaying region 1, whereby the transmittance of the display panel progressively increases in steps in the first displaying region 1, the third displaying region 3 and the second displaying region 2. Further, because the pixel units in the third displaying region 3 are evenly distributed, and the pixel units in the second displaying region 2 are evenly distributed, when vapor deposition is performed in the second displaying region 2 and the third displaying region 3 by using a mask, the pixel openings in the mask are also evenly distributed, which can reduce the risk of wrinkling in the deploying of the mask.

Optionally, as shown in FIGS. 2 and 3, the third displaying region 3 is provided with second cathode-removal regions 31. The second cathode-removal regions 31 are located in the gaps between at least two pixel units in the third displaying region 3.

It should be noted that, likewise, the second cathode-removal regions 31 may be fabricated by vapor-depositing the cathode on the entire surface, and subsequently removing the cathode in a pattern by using laser. That may also be performed by vacuum vapor deposition by using a vapor-deposition mask, which particularly includes, before the vapor deposition of the cathode, firstly vapor-depositing a layer of a material rejecting the cathode material by using a patterned mask, which is referred to as an inhibitor, wherein the pattern of the cathode inhibitor material is the same as the pattern of the cathode-removal parts. After the deposition of the inhibitor material has been completed, the deposition of the cathode at the entire surface is subsequently performed. Because of the repulsive effect between the materials, the cathode cannot be adhered to the regions that have already had the inhibitor pattern, whereby the patterned cathode removal is realized, and the second cathode-removal regions 31 are formed in the third displaying region 3. Accordingly, by providing the second cathode-removal regions 31 in the third displaying region 3, the transmittance of the third displaying region 3 can be further increased, thereby further improving the optical effect and the displaying effect of the display panel.

Optionally, the shapes of the first cathode-removal regions 21 and the shapes of the second cathode-removal regions 31 are at least one of a circle and an ellipse.

It should be noted that the shapes of the first cathode-removal regions 21 may be elliptical, and the shapes of the second cathode-removal regions 31 may be circular. Alternatively, both of the shapes of the first cathode-removal regions 21 and the shapes of the second cathode-removal regions 31 are elliptical. Alternatively, both of the shapes of the first cathode-removal regions 21 and the shapes of the second cathode-removal regions 31 are circular. Because the circular shape or the elliptical shape can enable the areas of the first cathode-removal regions 21 and the second cathode-removal regions 31 to be maximized, the transmittances of the second displaying region 2 and the third displaying region 3 can be further increased.

Optionally, the second cathode-removal regions 31 are located in the gaps between two neighboring pixel units in the third displaying region 3. The first cathode-removal regions 21 are located between every two neighboring rows of the pixel units in the second displaying region 2, and located between every two neighboring pixel units.

It should be noted that, when the positions of the pixel units in the third displaying region 3 and the positions of pixel units in the first displaying region 1 maintain the same, ½ of the pixel units are evenly removed, and, in the second displaying region 2, based on the third displaying region 3, one row of the pixels are removed every two rows, the second cathode-removal regions 31 are caused to be located in the gaps between two neighboring pixel units in the transverse direction and the longitudinal direction of the third displaying region 3. The first cathode-removal regions 21 are caused to be located between every two neighboring rows of the pixel units in the second displaying region 2, and located between every two neighboring pixel units; in other words, the first cathode-removal regions 21 are caused to be located in the gaps between two neighboring pixel units in the longitudinal direction of the second displaying region 2.

Optionally, every two neighboring rows of the second cathode-removal regions 31 are distributed in stagger.

It should be noted that that every two neighboring rows of the second cathode-removal regions 31 are distributed in stagger refers to that the one second cathode-removal region 31 located in the first row is located between two second cathode-removal regions 31 in one neighboring row of the first row. That can enable the second cathode-removal regions 31 to be evenly distributed, which, while increasing the transmittance of the third displaying region 3, facilitates to perform patterned removing of the cathode to form the second cathode-removal regions 31, which facilitates to simplify the fabricating process.

Figure 20:
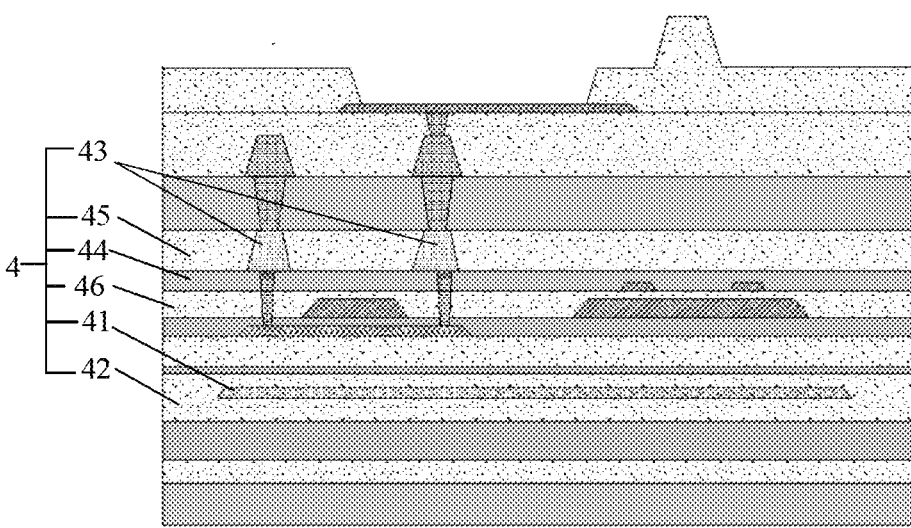
FIG. 20 shows a schematic structural diagram of a pixel-circuit baseplate according to an embodiment of the present disclosure.

Furthermore, when the second displaying region 2 and the third displaying region 3 of the display panel change, the wirings of the pixel-circuit baseplate 4 also change based on the changing of the second displaying region 2 and the third displaying region 3, which is particularly as follows:

In some embodiments, as shown in FIG. 20, the display panel further includes a pixel-circuit baseplate 4. The pixel-circuit baseplate 4 includes a shielding layer 41 and a barrier layer 42, the shielding layer 41 is provided inside the barrier layer 42, a first opening pattern and a second opening pattern are provided inside the barrier layer 42, the projection of the first opening pattern on the barrier layer in a first direction and the projections of the first cathode-removal regions 21 on the barrier layer 42 in the first direction coincide, and the projection of the second opening pattern on the barrier layer 42 in the first direction and the projections of the second cathode-removal regions 31 on the barrier layer in the first direction coincide, wherein the first direction refers to the direction perpendicular to the plane where the barrier layer 42 is located.

Figure 5:
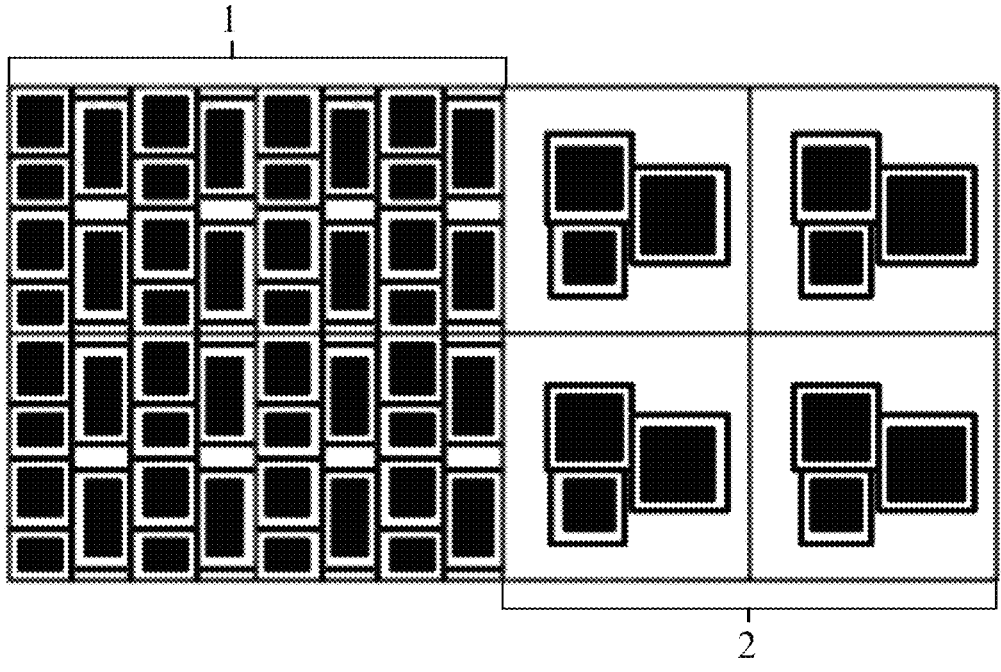
FIG. 5 shows a schematic diagram of the second type of arrangement of the pixel units included in the first displaying region according to an embodiment of the present disclosure.
Figure 6:
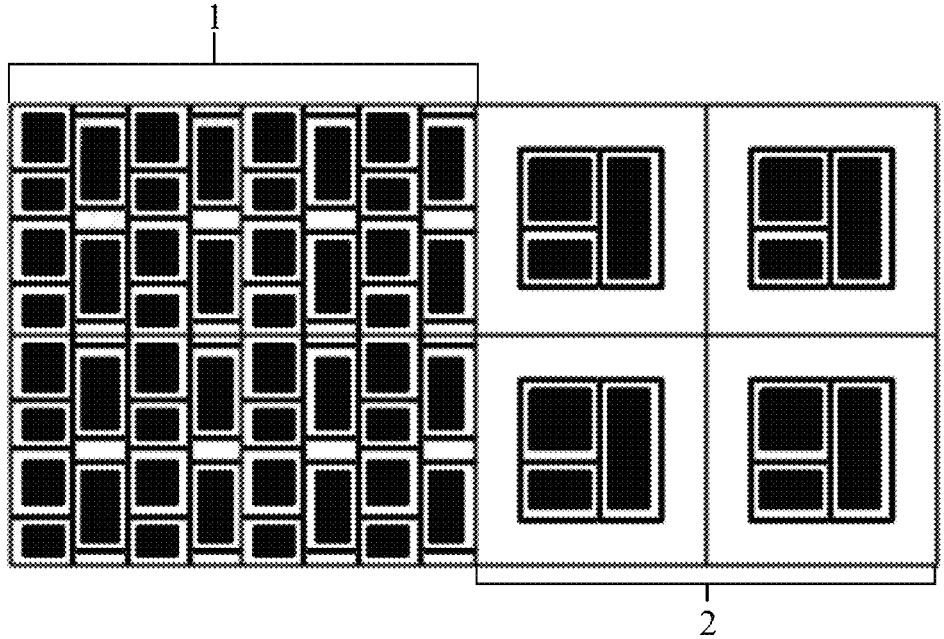
FIG. 6 shows a schematic diagram of the third type of arrangement of the pixel units included in the first displaying region according to an embodiment of the present disclosure.
Figure 7:
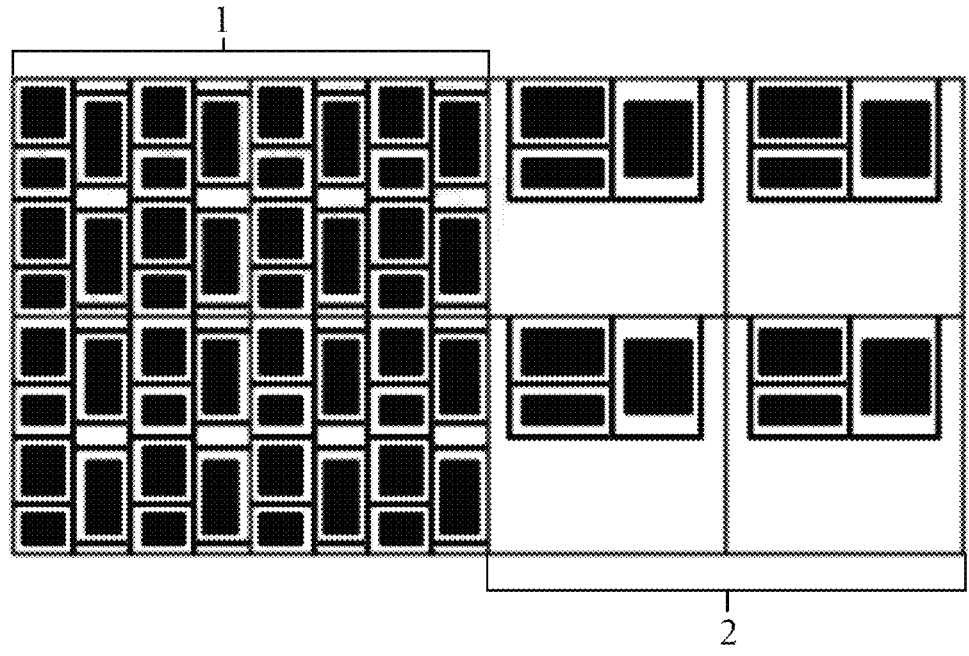
FIG. 7 shows a schematic diagram of the fourth type of arrangement of the pixel units included in the first displaying region according to an embodiment of the present disclosure.
Figure 8:
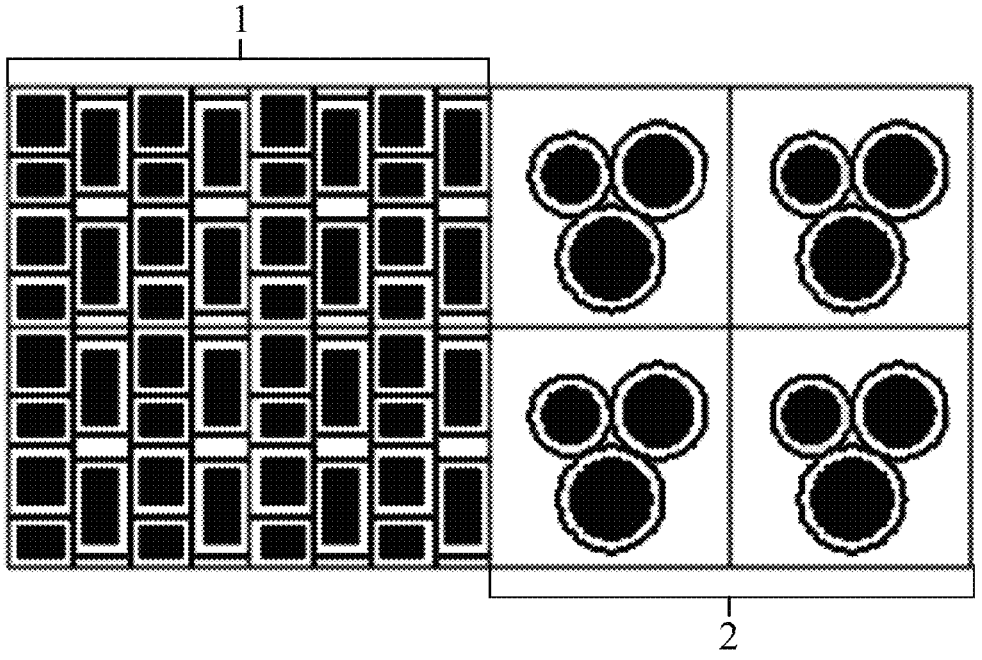
FIG. 8 shows a schematic diagram of the fifth type of arrangement of the pixel units included in the first displaying region according to an embodiment of the present disclosure.
Figure 9:
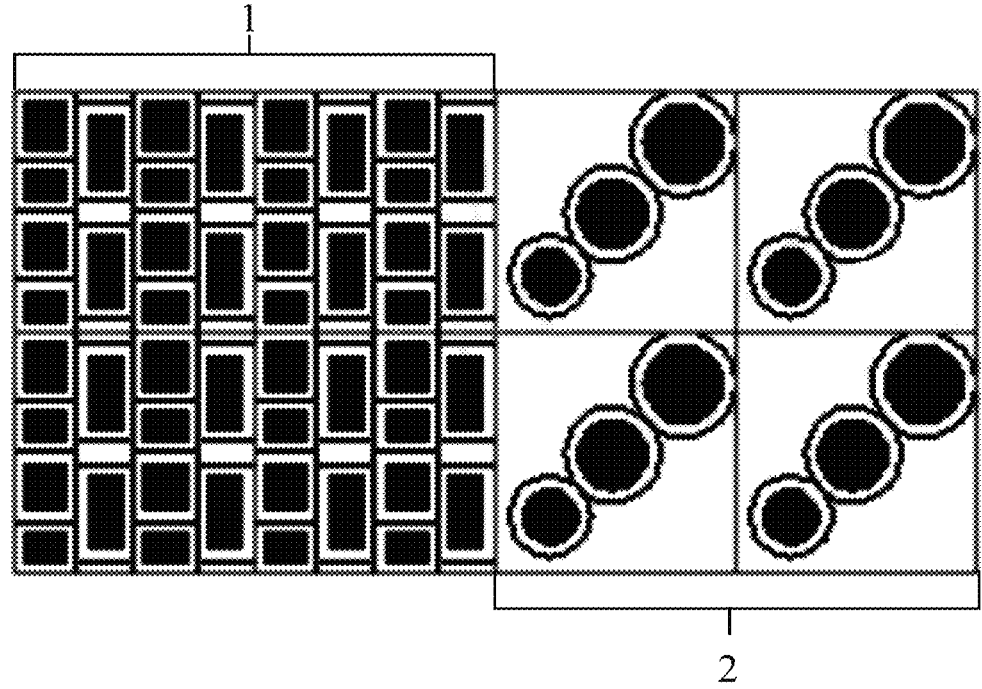
FIG. 9 shows a schematic diagram of the sixth type of arrangement of the pixel units included in the first displaying region according to an embodiment of the present disclosure.
Figure 10:
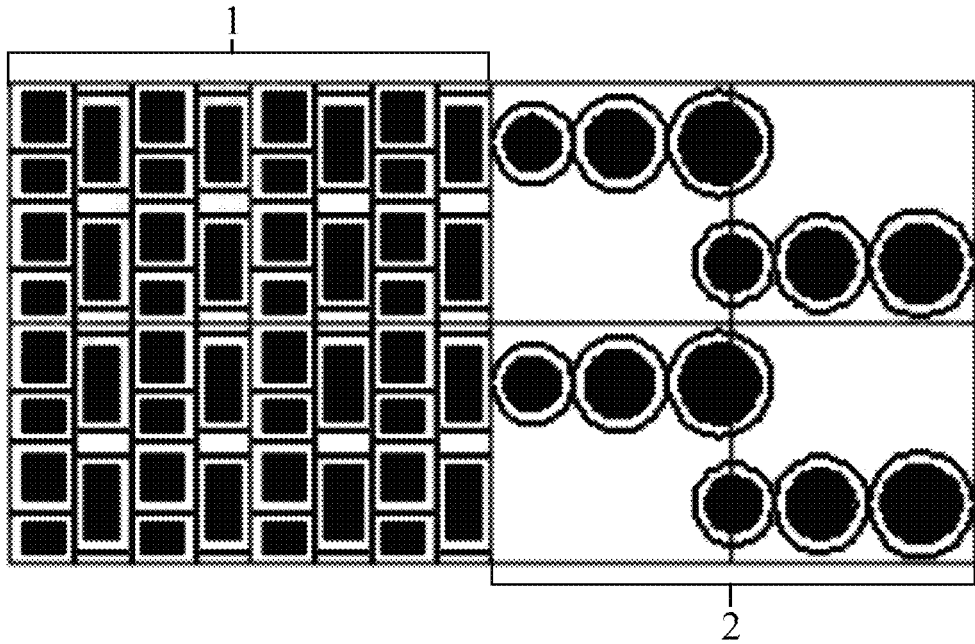
FIG. 10 shows a schematic diagram of the seventh type of arrangement of the pixel units included in the first displaying region according to an embodiment of the present disclosure.
Figure 19:
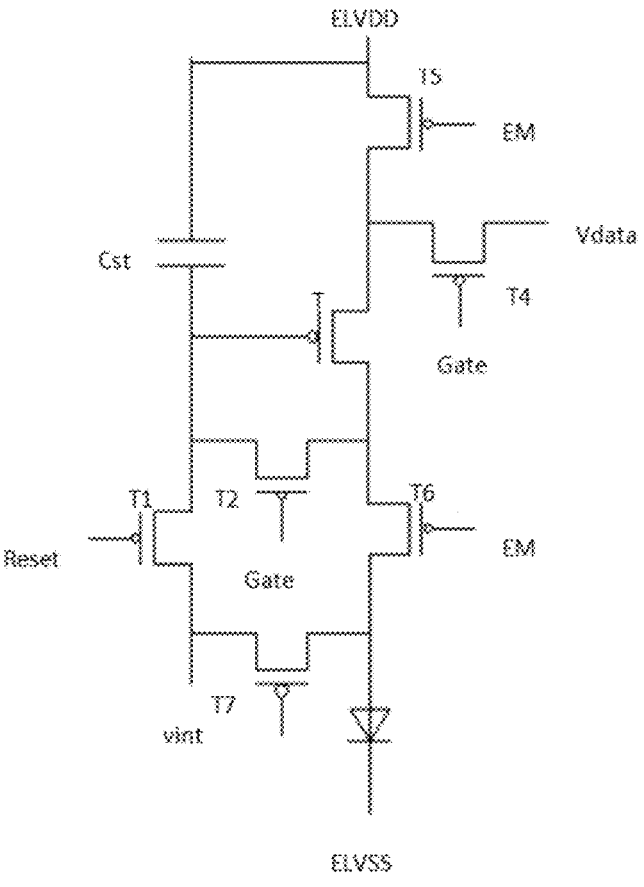
FIG. 19 shows a schematic structural diagram of the pixel circuit of a pixel-circuit baseplate according to an embodiment of the present disclosure.

It should be noted that, as shown in FIG. 19, the pixel circuit of the pixel-circuit baseplate 4 is of a 7T1C structure (i.e., seven transistors and one capacitor). As shown in FIG. 5, FIG. 5 is a schematic diagram of a pixel circuit of 7T1C, which includes a driving transistor, a data writing-in transistor, a storage capacitor, a threshold compensating transistor, a first resetting transistor, a second resetting transistor, a first light-emission controlling transistor and a second light-emission controlling transistor.

Furthermore, the circuit wiring of the three sub-pixels of each of the pixel units in the first displaying region 1 is rectangular, and the electric circuits of the three sub-pixels form one basic pixel-circuit unit. Because the pixel densities of the second displaying region 2 and the third displaying region 3 change, the first cathode-removal regions 21 are provided in the second displaying region 2, and the second cathode-removal regions 31 are provided in the third displaying region 3, the components inside the pixel-circuit baseplate 4 are required to be adaptatively adjusted according to the positions and the shapes of the first cathode-removal regions 21 and the second cathode-removal regions 31.

Particularly, the pixel-circuit baseplate 4 includes a shielding layer 41 and a barrier layer 42, the barrier layer 42 is formed between a buffer layer and a thin polyimide film, the barrier layer 42 includes two silicon-oxide layers, and the shielding layer 41 is provided in one of the silicon-oxide layers that is close to the buffer layer. Because the first opening pattern and the second opening pattern are provided inside the barrier layer 42, the projection of the first opening pattern on the barrier layer in the first direction and the projections of the first cathode-removal regions 21 on the barrier layer 42 in the first direction coincide, the projection of the second opening pattern on the barrier layer 42 in the first direction and the projections of the second cathode-removal regions 31 on the barrier layer in the first direction coincide, the shapes of the first cathode-removal regions 21 and the shape of the first opening pattern are the same, and the shapes of the second cathode-removal regions 31 and the shape of the second opening pattern are the same, the shielding layer 41 can wholly shield the pixel-circuit region.

Optionally, the pixel-circuit baseplate 4 further includes a source-drain metal layer 43, an electrically insulating layer 44, a passivation layer 45 and a grid insulating layer 46. The electrically insulating layer 44 is located between the passivation layer 45 and the grid insulating layer 46, the shielding layer 41 is connected to the source-drain metal layer 43 by the electrically insulating layer 44, and the shielding layer 41 is of a metal material. Accordingly, the shielding layer 41 can block light from passing through the gaps between the wirings of the pixel circuit to cause optical diffraction, whereby the functional element, when applied to a photographing scene, has the effect of dazzle light, thereby improving the effect of photographing of the functional element.

Figure 21:
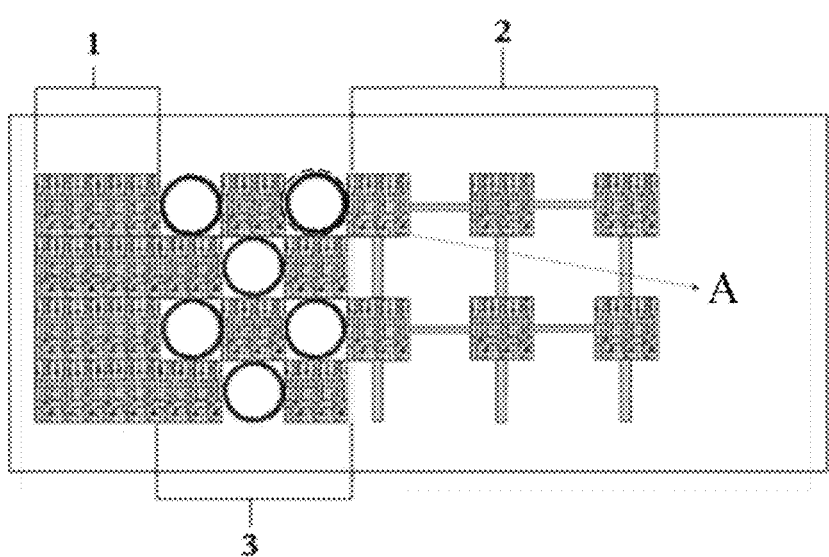
FIG. 21 shows a first schematic diagram of the wirings of the pixel circuit of a display panel according to an embodiment of the present disclosure.
Figure 22:
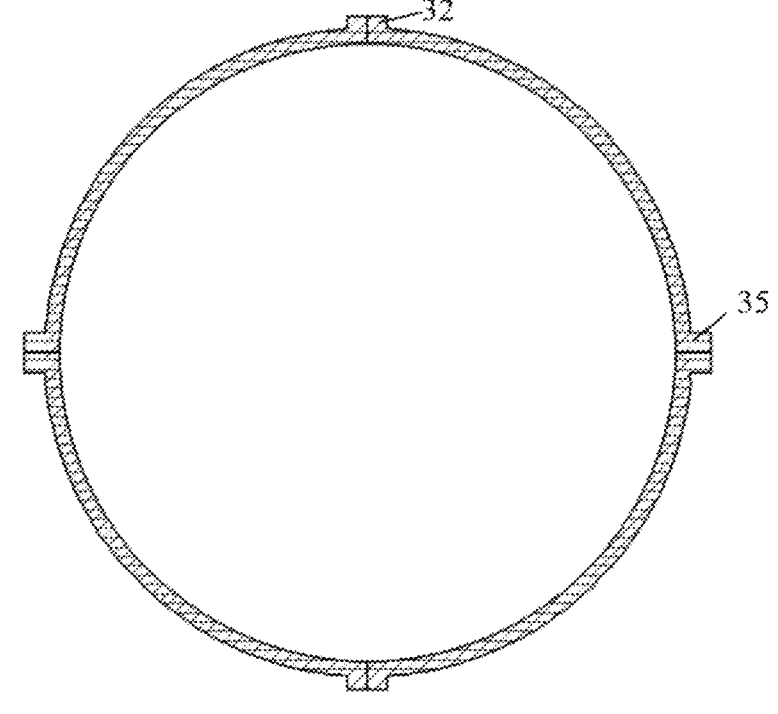
FIG. 22 shows a partially enlarged schematic diagram at the position A of FIG. 21 of the schematic diagram of the wirings of the pixel circuit of a display panel according to an embodiment of the present disclosure.
Figure 23:
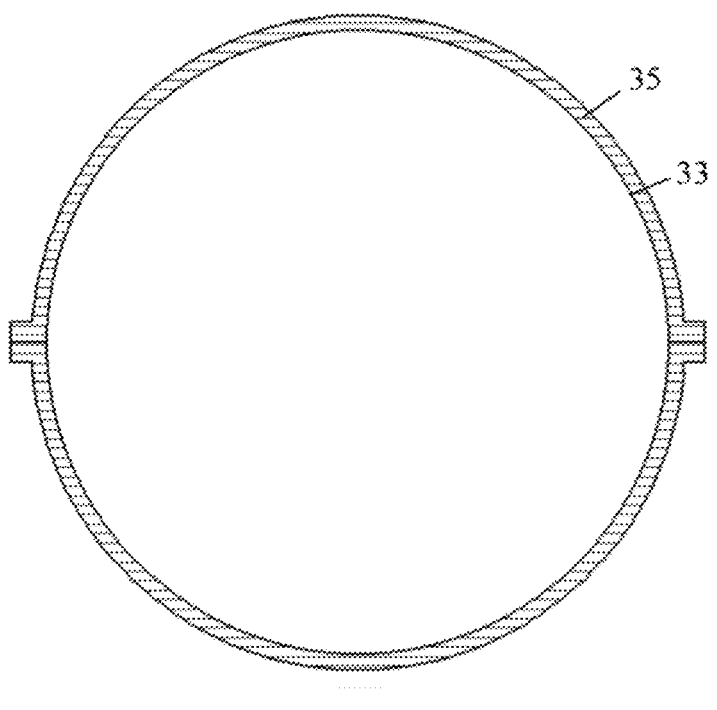
FIG. 23 shows a schematic diagram of the transverse wirings of the pixel circuit of a display panel according to an embodiment of the present disclosure.
Figure 24:
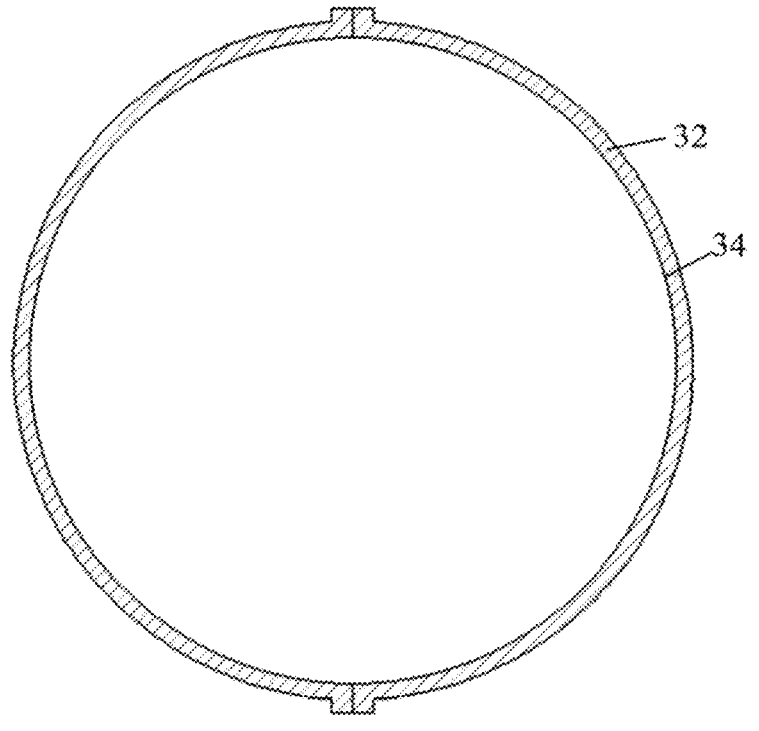
FIG. 24 shows a schematic diagram of the longitudinal wirings of the pixel circuit of a display panel according to an embodiment of the present disclosure.

In some embodiments, as shown in FIGS. 21, 22 and 23, the wirings of transverse signal lines 35 between the pixel units in the third displaying region 3 enclose a first pattern 33. As shown in FIGS. 21, 22 and 24, wirings of longitudinal signal lines 32 between the pixel units in the third displaying region 3 enclose a second pattern 34, the projection of the first pattern 33 on the substrate baseplate and the projections of the second cathode-removal regions 31 on the substrate baseplate coincide, and the projection of the second pattern 34 on the substrate baseplate and the projections of the second cathode-removal regions 31 on the substrate baseplate coincide. The shape of a cavity enclosed by the first pattern 33 and the shapes of the second cathode-removal regions 31 are the same, and the shape of a cavity enclosed by the second pattern 34 and the shapes of the second cathode-removal regions 31 are the same.

It should be noted that the transverse signal lines 35 between the pixel units in the third displaying region 3 may include initializing signal lines, restarting signal lines, light emitting signal lines and controlling signal lines; in other words, the wirings extend in the direction parallel to the initializing signal lines. The wirings of the transverse signal lines 35 between the pixel units in the third displaying region 3 are shown by A in FIG. 21. The longitudinal signal lines 32 between the pixel units in the third displaying region 3 are data signal lines; in other words, the wirings extend in the direction perpendicular to the initializing signal lines. The wirings of the transverse signal lines 35 between the pixel units in the third displaying region 3 are shown by A in FIG. 21. Because the shape of the cavity of the first pattern 33 enclosed by the wirings of the transverse signal lines 35 between the pixel units in the third displaying region 3, the shape of the cavity of the second pattern 34 enclosed by the wirings of the longitudinal signal lines 32 between the pixel units in the third displaying region 3 and the shapes of the second cathode-removal regions 31 are the same, that, in an aspect, can increase the transmittance of the third displaying region 3, and, in another aspect, can reduce the probability of diffraction.

Figure 25:
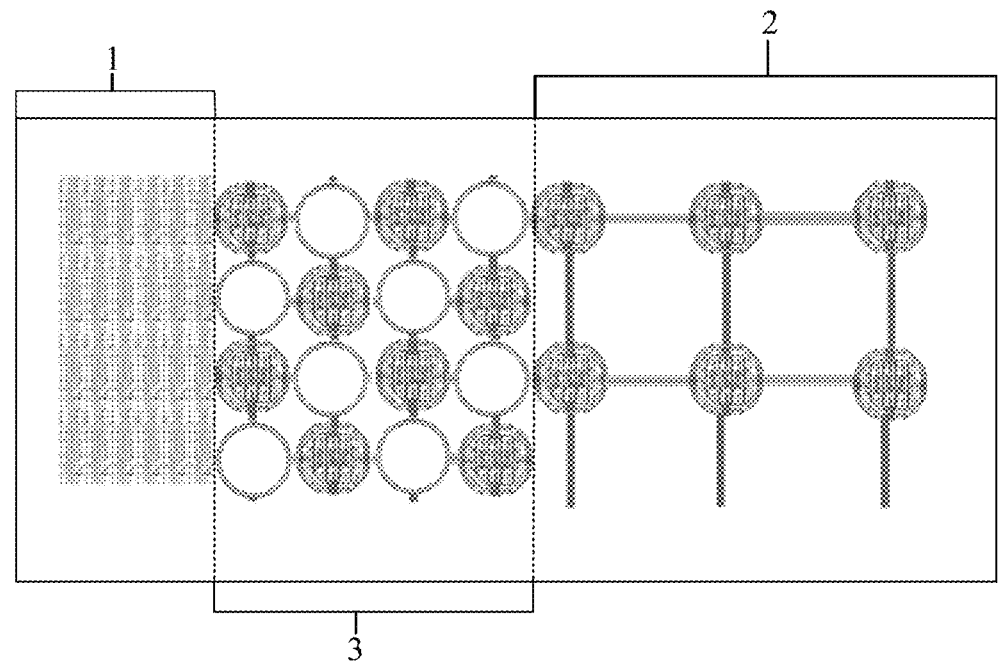
FIG. 25 shows a second schematic diagram of the wirings of the pixel circuit of a display panel according to an embodiment of the present disclosure.

Optionally, as shown in FIG. 25, the wirings of the transverse signal lines between the pixel units in the second displaying region 2 are straight lines, and the wirings of the longitudinal signal lines between the pixel units in the second displaying region 2 are straight lines.

It should be noted that, as compared with the third displaying region 3, the pixel density of the second displaying region 2 is further reduced. Therefore, the wirings of the transverse signal lines between the pixel units in the second displaying region 2 are straight lines, and the wirings of the longitudinal signal lines between the pixel units in the second displaying region 2 are straight lines, which can facilitate to provide the first cathode-removal regions 21 at the gap regions formed by the wirings of the signal lines of the second displaying region 2.

Optionally, as shown in FIG. 22, when the shapes of the second cathode-removal regions 31 are circular, both of the shape of the first pattern and the shape of the second pattern are circular. Accordingly, the shape of the first pattern and the shape of the second pattern can match with the shape of the second cathode-removal regions 31, thereby reducing optical diffraction at the four corners, to improve the effect of photographing when the optical functional element is applied to a photographing scene.

Figure 26:
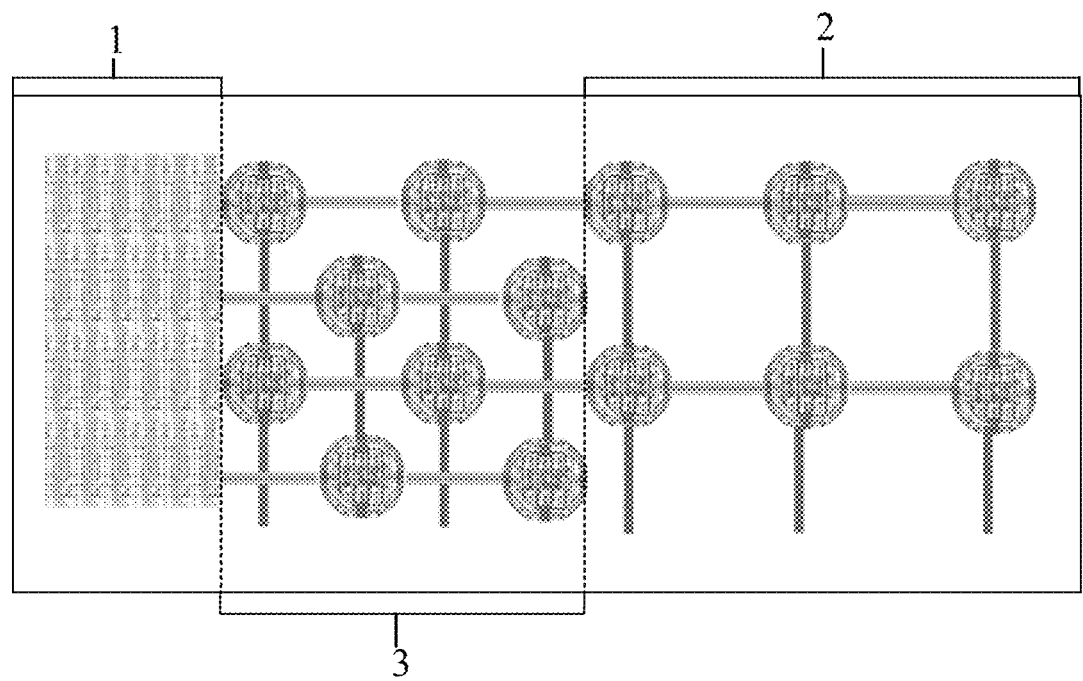
FIG. 26 shows a third schematic diagram of the wirings of the pixel circuit of a display panel according to an embodiment of the present disclosure.

Optionally, as shown in FIG. 26, the trajectories of the wirings of signal lines between the pixel units in the second displaying region 2 and the pixel units in the third displaying region 3 are straight lines. That enables the wiring of the display panel to be simpler, and simplifies the wiring mode, thereby saving the fabrication cost of the display panel.

It can be seen from the above embodiments that, in the embodiments of the present disclosure, because the pixel density of the second displaying region 2 is a preset multiple of the pixel density of the first displaying region 1, and the preset multiple is a multiple value less than 1 and greater than 0, the area of the gap between two neighboring pixel units in the second displaying region 2 is increased as compared with the area of the gap between two neighboring pixel units in the first displaying region 1. Additionally, the second displaying region 2 is provided with the first cathode-removal regions 21, and the first cathode-removal regions 21 are located in the gaps between at least two pixel units in the second displaying region 2, whereby the transmittance of the second displaying region 2 is greater than the transmittance of the first displaying region 1. Further, because the second displaying region 2 is located in the first region of the display surface of the display panel, and the first region is a region opposite to the region of the bottom of the display surface of the display panel where a functional element is provided, the transmittance of the region of the display surface of the display panel that faces the region where the functional element is provided is increased as compared with the transmittances of the other regions, which enables the functional element to normally sense light, thereby improving the optical effect and the displaying effect of the display panel.

In the second aspect, an embodiment of the present disclosure further provides a displaying device, wherein the displaying device includes a functional element and the display panel according to any one of the embodiments in the first aspect.

It should be noted that the displaying device may be a mobile displaying device such as a mobile phone, a tablet personal computer, a notebook computer, a palmtop, an onboard displaying device, a wearable device, an ultra-mobile personal computer (UMPC), a netbook and a personal digital assistant (PDA), or a non-mobile displaying device such as a personal computer (PC), a television set (TV), a teller machine and a self-service machine, which is not particularly limited in the embodiments of the present disclosure. The advantageous effects of the displaying device are the same as the advantageous effects of the display panel stated above, and are not discussed further in the embodiments of the present disclosure.

The projection of a sensing component or a function triggering component of the functional element on a substrate baseplate at least partially overlaps with the projections of the cathode-removal regions on the substrate baseplate. That can ensure that the functional element can normally sense light.

Optionally, the functional element includes a camera, an infrared-radiation element, a reflected-light sensing element, an ambient-light sensor, a fingerprint identifying element and a sound emitting element. Accordingly, when the transmittance of the second displaying region 2 of the display panel is greater than the transmittance of the first displaying region 1, because the second displaying region 2 is located in the first region of the display surface of the display panel, and the first region is a region opposite to the region of the bottom of the display surface of the display panel where the functional element is provided, the transmittance of the region of the display surface of the display panel that is opposite to the region where the functional element is provided is increased as compared with the transmittances of the other regions, which enables the functional element to normally sense light, thereby improving the optical effect and the displaying effect of the display panel.

Figure 27:
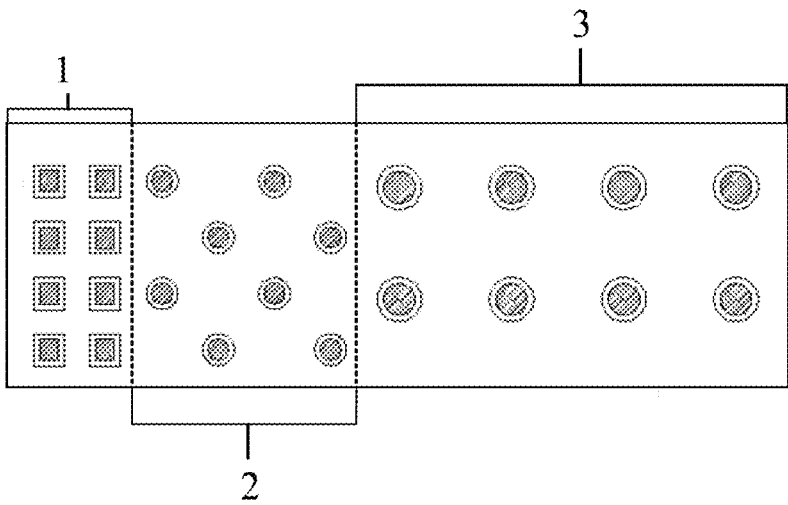
FIG. 27 shows a schematic diagram of the sub-pixel mask opening pattern of a display panel according to an embodiment of the present disclosure.
Figure 28:
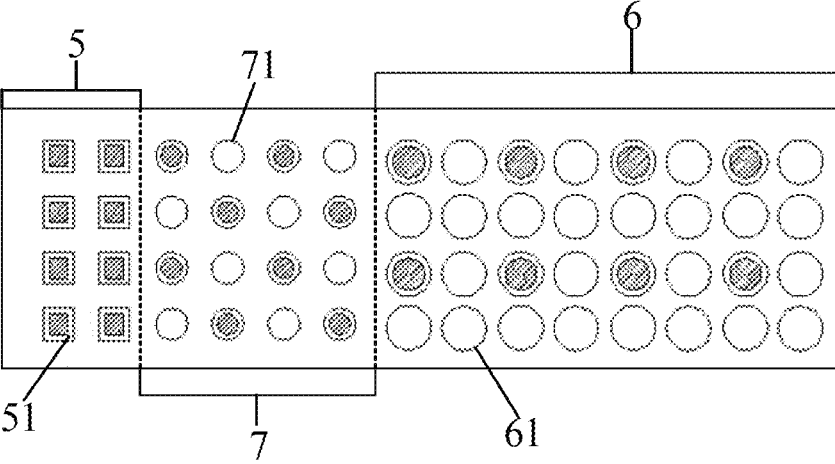
FIG. 28 shows a schematic diagram of the distribution of the pixel openings of a mask according to an embodiment of the present disclosure.

In the third aspect, as shown in FIGS. 27 and 28, an embodiment of the present disclosure further provides a mask, the mask being used for forming the display panel according to any one of the embodiments in the first aspect by vapor deposition. The mask includes a first opening region 5 and a second opening region 6. The first opening region 5 is for vapor-depositing the first displaying region 1, and the second opening region 6 is for vapor-depositing the second displaying region 2. The first opening region 5 includes a plurality of first pixel openings 51, the second opening region 6 includes a plurality of second pixel openings 61, the shapes of the first pixel openings 51 and the shapes of the mask openings of the pixel units in the first displaying region 1 are the same, and the shapes of the second pixel openings 61 and the shapes of the mask openings of the pixel units in the second displaying region 2 are the same. Each of the first pixel openings 51 is opposite to one of the pixel units in the first displaying region 1, each of the pixel units in the second displaying region 2 is opposite to one of the second pixel openings 61, and a gap position between every two neighboring pixel units in the second displaying region 2 is opposite to one of the second pixel openings 61.

It should be noted that that each of the pixel units in the second displaying region 2 is opposite to one of the second pixel openings 61, which refers to that each of the second pixel openings 61 provided in the mask corresponds to one of the pixel units in the second displaying region 2, and that a gap position between every two neighboring pixel units in the second displaying region 2 is opposite to one of the second pixel openings 61, which refers to that a pixel-opening region is provided at the region of the second displaying region 2 where the pixels are reduced as compared with the first displaying units. As an example, when the positions of the pixel units in the second displaying region 2 and the positions of the pixel units in the first displaying region 1 maintain the same, and ¼ of the pixel units are evenly removed, in the transverse direction, one second pixel opening 61 is provided correspondingly between every two neighboring pixel units, and second pixel openings 61 of the quantity equal to the quantity of the pixel units in every row of the first displaying units are provided between every two neighboring rows. Accordingly, because the excessive second pixel openings 61 are added, when vacuum vapor deposition of an organic luminescent material is performed in the second displaying region 2, the material is deposited on the baseplate, and because the organic luminescent material has a higher transmittance, that has a lower influence on the transmittance of the display panel.

Optionally, the pixel units in the second displaying region 2 are evenly distributed. The quantity of the first pixel openings 51 and the quantity of the second pixel openings 61 are equal, and the form of the arrangement of the first pixel openings 51 in the first opening region 5 and the form of the arrangement of the second pixel openings 61 in the second opening region 6 are the same, wherein the arrangement of the first pixel openings 51 in the first opening region 5 refers to the quantities of the first pixel openings 51 provided in the transverse direction and the longitudinal direction of the first opening region 5, and the arrangement of the second pixel openings 61 in the second opening region 6 refers to the quantities of the second pixel openings 61 provided in the transverse direction and the longitudinal direction of the second opening region 6. Accordingly, by adding the compensating second pixel openings 61, the opening patterns in the mask are in an even array, and, when stretched, have a uniform strain and do not have wrinkles, which cause color mixing.

Optionally, the display panel further includes a third displaying region 3. The mask further includes a third opening region 7, and the third opening region 7 is for vapor-depositing the third displaying region 3. The third opening region 7 includes a plurality of third pixel openings 71, the shapes of the third pixel openings 71 and the shapes of the mask openings of the pixel units in the third displaying region 3 are the same, each of the pixel units in the third displaying region 3 is opposite to one of the third pixel openings 71, and a gap position between every two neighboring pixel units in the third displaying region 3 is opposite to one of the second pixel openings 61.

It should be noted that, as similar to the second displaying region 2, after the excessive third pixel openings 71 have been added, when vacuum vapor deposition of an organic luminescent material is performed in the third displaying region 3, the material is deposited on the baseplate, and because the organic luminescent material has a higher transmittance, that has a lower influence on the transmittance of the display panel.

It can be seen from the above embodiments that, in the embodiments of the present disclosure, because the shapes of the first pixel openings 51 and the shapes of the mask openings of the pixel units in the first displaying region 1 are the same, the shape of the second pixel openings 61 and the shape of the mask openings of the pixel units in the second displaying region 2 are the same, each of the first pixel openings 51 is opposite to one of the pixel units in the first displaying region 1, each of the pixel units in the second displaying region 2 is opposite to one of the second pixel openings 61, and a gap position between every two neighboring pixel units in the second displaying region 2 is opposite to one of the second pixel openings 61, excessive second pixel openings 61 are added. When vacuum vapor deposition of an organic luminescent material is performed in the second displaying region 2, the material is deposited on the baseplate, and because the organic luminescent material has a higher transmittance, that has a lower influence on the transmittance of the display panel. Furthermore, when the pixel units in the second displaying region 2 are evenly distributed, the quantity of the first pixel openings 51 and the quantity of the second pixel openings 61 are equal, and the form of the arrangement of the first pixel openings 51 in the first opening region 5 and the form of the arrangement of the second pixel openings 61 in the second opening region 6 are the same, the opening patterns in the mask are in an even array, and, when stretched, have a uniform strain and do not have wrinkles, which cause color mixing.

It should be noted that the embodiments of the description are described in the mode of progression, each of the embodiments emphatically describes the differences from the other embodiments, and the same or similar parts of the embodiments may refer to each other.

Although alternative embodiments of the embodiments of the present disclosure have been described, once a person skilled in the art has known the essential inventive concept, he may make further variations and modifications on those embodiments. Therefore, the appended claims are intended to be interpreted as including the alternative embodiments and all of the variations and modifications that fall in the scope of the embodiments of the present disclosure.

Finally, it should also be noted that, herein, relation terms such as first and second are merely intended to distinguish one entity from another entity, and that does not necessarily require or imply that those entities have therebetween any such actual relation or order. Furthermore, the terms "include", "comprise" or any variants thereof are intended to cover non-exclusive inclusions, so that articles or terminal devices that include a series of elements do not only include those elements, but also include other elements that are not explicitly listed, or include the elements that are inherent to such articles or terminal devices. Unless further limitation is set forth, an element defined by the wording "comprising a . . . " does not exclude additional same element in the article or terminal device comprising the element.

The technical solutions of the present disclosure have been described in detail above. The principle and the embodiments of the present disclosure are described herein with reference to the particular examples. Moreover, for a person skilled in the art, according to the principle and the implementations of the present disclosure, the particular embodiments and the range of application may be varied. In conclusion, the contents of the description should not be understood as limiting the present disclosure.

The invention claimed is:

1. A display panel, wherein the display panel comprises a first displaying region and a second displaying region;
   the second displaying region is located in a first region of a display surface of the display panel, and a pixel density of the second displaying region is a preset multiple of a pixel density of the first displaying region, whereby a transmittance of the second displaying region is greater than a transmittance of the first displaying region;
   the second displaying region is provided with first cathode-removal regions, and the first cathode-removal regions are located in gaps between at least two pixel units in the second displaying region; and
   the preset multiple is a multiple value less than 1 and greater than 0, and the first region is a region opposite to a region of a bottom of the display surface of the display panel where an optical functional element is provided,
   wherein the display panel further comprises a third displaying region; and
   the third displaying region is located between the first displaying region and the second displaying region, and a pixel density of the third displaying region is greater than the pixel density of the second displaying region, and less than the pixel density of the first displaying region,
   wherein the third displaying region is provided with second cathode-removal regions; and
   the second cathode-removal regions are located in gaps between at least two pixel units in the third displaying region.

2. The display panel according to claim 1, wherein a shape of a sub-pixel opening of at least one of the pixel units in the second displaying region is circular.

3. The display panel according to claim 1, wherein the first cathode-removal regions are arranged in an array.

4. The display panel according to claim 1, wherein the display panel further comprises a substrate baseplate; and
   projections of the first cathode-removal regions on the substrate baseplate and projections of luminescent layers of the pixel units in the second displaying region on the substrate baseplate do not overlap.

5. The display panel according to claim 1, wherein a minimum distance between sub-pixels of a same color in two neighboring pixel units in the first displaying region is a first distance; and
   a minimum distance between sub-pixels of a same color in two neighboring pixel units in the second displaying region is a second distance, wherein the first distance is greater than the second distance.

6. The display panel according to claim 1, wherein shapes of the first cathode-removal regions and shapes of the second cathode-removal regions are at least one of a circle and an ellipse.

7. The display panel according to claim 1, wherein the pixel density of the third displaying region is a half of the pixel density of the first displaying region, the pixel density of the second displaying region is a quarter of the pixel density of the first displaying region, the pixel units in the third displaying region are evenly distributed, and the pixel units in the second displaying region are evenly distributed.

8. The display panel according to claim 7, wherein the second cathode-removal regions are located in gaps between two neighboring pixel units in the third displaying region; and the first cathode-removal regions are located between every two neighboring rows of the pixel units in the second displaying region.

9. The display panel according to claim 8, wherein every two neighboring rows of the second cathode-removal regions are distributed in stagger.

10. The display panel according to claim 1, wherein the display panel further comprises a pixel-circuit baseplate;

the pixel-circuit baseplate comprises a shielding layer and a barrier layer, the shielding layer is provided inside the barrier layer, a first opening pattern and a second opening pattern are provided inside the barrier layer, and a projection of the first opening pattern on the barrier layer in a first direction and projections of the first cathode-removal regions on the barrier layer in the first direction coincide;

a projection of the second opening pattern on the barrier layer in the first direction and projections of the second cathode-removal regions on the barrier layer in the first direction coincide, wherein the first direction refers to a direction perpendicular to a plane where the barrier layer is located; and shapes of the first cathode-removal regions and a shape of the first opening pattern are the same, and shapes of the second cathode-removal regions and a shape of the second opening pattern are the same.

11. The display panel according to claim 10, wherein the pixel-circuit baseplate further comprises a source-drain metal layer, an electrically insulating layer, a passivation layer and a grid insulating layer; and the electrically insulating layer is located between the passivation layer and the grid insulating layer, the shielding layer is connected to the source-drain metal layer by the electrically insulating layer, and the shielding layer is of a metal material.

12. The display panel according to claim 1, wherein the display panel further comprises a substrate baseplate;

wirings of transverse signal lines between the pixel units in the third displaying region enclose a first pattern;

wirings of longitudinal signal lines between the pixel units in the third displaying region enclose a second pattern;

a projection of the first pattern on the substrate baseplate and a projection of each of the second cathode-removal regions on the substrate baseplate coincide, and a projection of the second pattern on the substrate baseplate and a projection of each of the second cathode-removal regions on the substrate baseplate coincide; and a shape of a cavity enclosed by the first pattern and a shape of the second cathode-removal regions are the same, and a shape of a cavity enclosed by the second pattern and the shape of the second cathode-removal regions are the same.

13. The display panel according to claim 1, wherein each of the pixel units in the second displaying region comprises three sub-pixels, and connecting lines between center points of the three sub-pixels of at least one of the pixel units in the second displaying region form a triangle.

14. The display panel according to claim 6, wherein a value of the pixel density of the first displaying region, a value of the pixel density of the third displaying region and a value of the pixel density of the second displaying region form an arithmetic progression or a geometric progression.

15. A displaying device, wherein the displaying device comprises a functional element and the display panel according to claim 1; and a projection of a sensing component or a function triggering component of the functional element on a substrate baseplate at least partially overlaps with projections of cathode-removal regions on the substrate baseplate.

16. A mask, the mask being used for forming the display panel according to claim 1 by vapor deposition, wherein the mask comprises a first opening region and a second opening region;

the first opening region is for vapor-depositing the first displaying region, and the second opening region is for vapor-depositing the second displaying region;

the first opening region comprises a plurality of first pixel openings, the second opening region comprises a plurality of second pixel openings, shapes of the first pixel openings and shapes of mask openings of the pixel units in the first displaying region are the same, and shapes of the second pixel openings and shapes of the mask openings of the pixel units in the second displaying region are the same; and each of the first pixel openings is opposite to one of the pixel units in the first displaying region, each of the pixel units in the second displaying region is opposite to one of the second pixel openings, and a gap position between every two neighboring pixel units in the second displaying region is opposite to one of the second pixel openings.

17. The mask according to claim 16, wherein the pixel units in the second displaying region are evenly distributed; and a quantity of the first pixel openings and a quantity of the second pixel openings are equal, and a form of arrangement of the first pixel openings in the first opening region and a form of arrangement of the second pixel openings in the second opening region are the same;

wherein the arrangement of the first pixel openings in the first opening region refers to quantities of the first pixel openings provided in a transverse direction and a longitudinal direction of the first opening region, and the arrangement of the second pixel openings in the second opening region refers to quantities of the second pixel openings provided in a transverse direction and a longitudinal direction of the second opening region.

18. The mask according to claim 16, wherein the display panel further comprises a third displaying region;

the mask further comprises a third opening region, and the third opening region is for vapor-depositing the third displaying region; and the third opening region comprises a plurality of third pixel openings, shapes of the third pixel openings and shapes of the mask openings of the pixel units in the third displaying region are the same, each of the pixel units in the third displaying region is opposite to one of the third pixel openings, and a gap position between every two neighboring pixel units in the third displaying region is opposite to one of the second pixel openings.

\* \* \* \* \*